(12) United States Patent
Kouvetakis et al.

(10) Patent No.: US 7,910,468 B1
(45) Date of Patent: Mar. 22, 2011

(54) METHODS AND COMPOSITIONS FOR PREPARING GE/SI SEMICONDUCTOR SUBSTRATES

(75) Inventors: John Kouvetakis, Mesa, AZ (US); Yan-Yan Fang, Tempe, AZ (US)

(73) Assignee: Arizona Board of Regents, A Body of the State of Arizona Acting for and on Behalf of Arizona State University, Scottsdale, AZ (US)

( * ) Notice: Subject to any disclaimer, the term of this patent is extended or adjusted under 35 U.S.C. 154(b) by 334 days.

(21) Appl. No.: 12/133,225

(22) Filed: Jun. 4, 2008

Related U.S. Application Data

(60) Provisional application No. 60/933,023, filed on Jun. 4, 2007.

(51) Int. Cl.
*H01L 21/3205* (2006.01)
*H01L 21/4763* (2006.01)
*H01L 21/31* (2006.01)
*H01L 21/469* (2006.01)

(52) U.S. Cl. ........ 438/592; 438/763; 438/765; 438/933; 427/255.23; 427/255.26; 427/255.35

(58) Field of Classification Search .................. None
See application file for complete search history.

(56) References Cited

OTHER PUBLICATIONS

Takeuchi (2007) Semicond Sci Technol, 22:S231-S235.
Soref (1993) Proceedings of IEEE, 81(12):1687-1706.
Soref (1996) J Vac Sci Technol, A 14(3): 913-918.
Soref (1993) Superlattices and Microstructures 14(2/3):189-193.
Green (2001) Prog Photovolt Res Appl 9:123-135.
Jalali (2006) IEEE Microwave Magazine 58-68.
Morrison ( ) Power Electronics Technology, 44-46.
Wietler (2006) Thin Solid Films 508:6-9.
Reiffel (1955) Physical Review 97(6):1714-1716.
Bills (1964) J Phys Chem 68(4):806-810.
Schwarz-Selinger (2002) Physical Review B 65:125317-1.
Kelly (2006) Appl. Phys. Lett., 88, 152101.
Kelly (2007) Semicond. Sci. Technol. 22, S204-S207.
Shang (2006) IBM Journal of Research and Development 50 (4/5): 377-386.
Anastassakis (1990) Physical Review B 41(11):7529-7535.
De Jaeger (2005) Microelectronic Engineering 80: 26-29.
Nakashima (2006) J Appl Phys 99:053512.
Anastassakis (1993) Solid State Communications 88(11/12):1053-1058.
Cerderia (1972) Physical Review B 5(2):580-593.
Fitzgerald (1997), Thin Solid Films, 294: 3-10.
Wietler (2005) App Phys Lett 87:182102.
Jutzi (2005) IEEE Photonics Technol Lett 17(7):1510-1512.
Kuo (2005) Nature 437: 1334-1336.
Lee (2005) J Appl Phys 97:011101.
Bauer (2003) Solid State Communications 127:355-359.
Cannon (2004) Appl Phys Lett 84(6): 906-908.
Ishikawa (2003) Appl Phys Lett 82(13):2044-2046.
Liu (2004) Physical Review B 70:155309.
Liu (2005) Appl. Phys. Lett. 87:103501.
Oh (2002) IEEE J. Quantum Electron 38(9):1238.
Cook (2004) Thin Solid Films 455-456:217-221.

(Continued)

*Primary Examiner* — Andy Huynh
*Assistant Examiner* — Valerie Brown
(74) *Attorney, Agent, or Firm* — McDonnell Boehnen Hulbert & Berghoff LLP

(57) ABSTRACT

The present disclosure describes methods for preparing semiconductor structures, comprising forming a Ge layer on a semiconductor substrate using an admixture of (a) $(GeH_3)_2CH_2$ and $Ge_2H_6$; (b) $GeH_3CH_3$ and $Ge_2H_6$; or (c) $(GeH_3)_2CH_2$, $GeH_3CH_3$ and $Ge_2H_6$, wherein in all cases, $Ge_2H_6$ is in excess. The disclosure further provides semiconductor structures formed according to the methods of the invention as well as compositions comprising an admixture of $(GeH_3)_2CH_2$ and/or $GeH_3CH_3$ and $Ge_2H_6$ in a ratio of between about 1:5 and 1:30. The methods herein provide, and the semiconductor structures provide, Ge layers formed on semiconductor substrates having threading dislocation density below $10^5/cm^2$ which can be useful in semiconductor devices.

27 Claims, 17 Drawing Sheets

OTHER PUBLICATIONS

Costa (2007) Physical Review B 76:035211.
Kouvetakis (2007) J Mater Chem 17:1649-1655.
Roucka (2007) J Appl Phys 101:013518.
Tice (2007) J Am Chem Soc 129(25): 7950-7960.
Bauer (2003) Appl Phys Lett 83(17):3489-3491.
Menendez (2004) Appl Phys Lett 85(7):1175-1177.
Roucka (2005) Appl Phys Lett 86:191912.
D'Costa (2006) Physical Review B 73:125207.
Aella (2004) Appl Phys Lett 84(6):888-890.
Bauer (2002) Appl Phys Lett 81(16):2992-2994.
Bauer (2003) Appl Phys Lett 83(11):2163-2165.
Kouvetakis (2006) Annu Rev Mater Res. 36:497-554.
Wistey (2007) Appl Phys Lett 90:082108.
Fang (2007) Chem Mater 19(24):5910-5925.
Fang (2007) Appl Phys Lett 90: 061915.
Luan (1999) Appl. Phys. Lett. 75: 2909.
Currie (1998) Appl. Phys. Lett. 72: 1718.
Fitzgerald, (1992) J. Vac. Sci. Technol. B 10: 1807.
Stirman (2004) Appl. Phys. Lett. 84: 2530.
Cunningham (1991) Appl. Phys. Lett. 59: 3574.
Tolle (2006) Appl. Phys. Lett. 88, 252112.

METHODS AND COMPOSITIONS FOR PREPARING GE/SI SEMICONDUCTOR SUBSTRATES

CROSS-REFERENCE TO RELATED APPLICATIONS

This application claims the benefit of the filing date, under 35 USC §119(e), of U.S. Provisional Application Ser. No. 60/933,023, filed 4 Jun. 2007, which is hereby incorporated by reference in its entirety.

STATEMENT OF GOVERNMENT INTEREST

The invention described herein was made in part with government support under grant number FA9550-06-01-0442, awarded by AFOSR under the MURI; and under grant number DMR-0526734, awarded by the National Science Foundation. The United States Government has certain rights in the invention.

BACKGROUND OF THE INVENTION

Elemental Ge exhibits many device advantages over pure Si. Its smaller bandgap is attractive for photodetector and modulator applications in the 1.3-1.6 µm wavelength range (see, Oh et al., IEEE J. Quantum Electron. 38, 1238 (2002); Liu et al., Appl. Phys. Lett. 87, 103501 (2005); and Kuo et al., Nature 437, 1334 (2005)). Transistors based on Ge should also provide greater speed performance due to higher carrier mobilities of this material. Since the manufacturing infrastructure for Si—Ge technologies is well established, the direct growth of Ge on Si could produce new classes of opto- and microelectronic systems, but such growth has been problematic. The conventional formation of mismatched (4%) Ge on Si typically proceeds via the Stranski-Krastanov mechanism yielding islands (after deposition of 3-4 monolayers) rather than relaxed, continuous layers. For thick films a high roughness is obtained and threading dislocation densities of $\sim 10^8$ cm$^{-2}$ are commonly observed (see, Kroemer et al., J. Cryst. Growth 95, 96 (1989)). Carrier scattering and traps at defect sites reduce mobility in electronic devices and also increase dark current in photodetectors.

Low temperature (T<375° C.) chemical vapor deposition (CVD) of GeH$_4$ has produced Ge layers directly on Si(100) possessing fairly smooth surfaces with occasional pits, and threading dislocation densities that appear to be too high for certain applications (see, Cunningham et al., Appl. Phys. Lett. 59, 3574 (1991)). Higher temperature growth (T>400° C.) invariably produces rougher layers that display the classic cross-hatched patterns created by strain relaxation and defect formation. The higher temperatures also increase the propensity of microcrack formation upon cooling of the samples (see, for example, Currie et al., Appl. Phys. Lett. 72, 1718 (1998); and Fitzgerald et al., J. Vac. Sci. Technol. B 10, 1807 (1992)) making such approaches incompatible with back end (post-metallization) CMOS processes. A more recent method utilizes thick graded buffers of Si$_{1-x}$Ge$_x$ in which the Ge content is gradually increased up to 100% to relieve the misfit strain with the substrate. Typically 10 µm is required to achieve acceptable levels of threading defects ($\sim 10^6$ cm$^{-2}$) and a complicated chemical mechanical polishing step is necessary to produce a smooth surface, making device processing expensive (see, Luan et al., Appl. Phys. Lett. 75, 2909 (1999)).

Growth of Ge on Si typically proceeds via the Stranski-Krastanov mechanism, yielding islands (after deposition of 3-4 monolayers) rather than relaxed, continuous layers. For thick films a high roughness is obtained and threading dislocation densities of $\sim 10^8$ cm$^{-2}$ are commonly observed, eventually producing the classic crosshatched surface morphologies (see, Fitzgerald and Samavedam, Thin Solid Films, 1997, 294, 3). Scattering and traps at defect sites reduce carrier mobility in electronic devices and also increase dark current in photodetectors. A variety of growth schemes have been developed in an attempt to circumvent some of these problems, including (i) the use of a graded Si—Ge buffer layer (see, Fitzgerald and Samavedam, supra), (ii) a two-step growth in which an initial thin buffer layer is deposited at low temperature, followed by the high temperature growth of the bulk material (see, Luan et al., supra), and (iii) surfactant-mediated epitaxy using As and Sb atomic beams (see, Wietler et al., Appl. Phys. Lett. 2005, 87, 182102). The compositionally graded Si$_{1-x}$Ge$_x$ buffer layer approach has been demonstrated via UHV-CVD. The Ge concentration is gradually increased as a function of layer thickness, and the terminal Ge portion of the stack exhibits a defect density of $10^7$ cm$^{-2}$ and a high AFM RMS roughness of 50 nm. A post growth chemical mechanical polishing step is then conducted to reduce the surface roughness to a level that allows subsequent growth of lower defect density overlayers of the Ge material. The drawbacks of this method include excessive final film thicknesses ($\sim 11$ µm) and a relatively large residual surface roughness, both of which are problematic for device fabrication. An alternative two-step UHV-CVD process has also been developed (current state-of-the-art) to produce relaxed Ge on Si films with relatively flat surfaces. Here an initiation layer of $\sim 50$ nm in thickness is first grown at low temperatures of $\sim 350°$ C. This layer is intended to facilitate subsequent bulk growth at higher temperatures $\sim 800\text{-}900°$ C. and significantly enhanced rates. In this process the excess hydrogen on the growth surface is believed to act as a surfactant, thereby promoting the formation of misfit dislocations parallel to the Ge/Si interface which relieve the misfit strain. The surface morphology of the resultant films reveals an AFM RMS roughness value of 0.5 nm with no sign of the crosshatch pattern attributed to strain relaxations. However, defect densities of $2.3 \times 10^7$ cm$^{-2}$ are purportedly present even after thermal cycling of the samples between 780-900° C. Further reductions in defect densities to levels as low as $\sim 2 \times 10^6$ cm$^{-2}$ can be obtained using this method via selective growth on oxide patterned Si wafers (see, Fitzgerald and Samavedam, supra). In recent years more conventional surfactant-based approaches have been implemented via MBE to grow Ge layers with suitable morphologies using solid sources of As or Sb. This is typically achieved by first depositing a completed surfactant monolayer on clean Si prior to growth of pure Ge. Using this method $\sim 1$ µm Ge thick films with defect densities of $\sim 2 \times 10^7$ have been demonstrated at 700° C. (the surface roughness was not reported in this case; see, Wietler et al., supra). The resultant films have been found to exhibit tensile strains as high as 0.2% due to the thermal mismatch with the Si substrate. They are also unintentionally doped by the As/Sb surfactant.

These issues have prompted us to consider an alternative, more straightforward approach which obviates the need for thick buffers and associated processing problems.

SUMMARY OF THE INVENTION

In one aspect, the present invention provides methods for preparing a semiconductor structure, comprising forming a Ge layer on a semiconductor substrate using an admixture of (a) $(GeH_3)_2CH_2$ and $Ge_2H_6$; (b) $GeH_3CH_3$ and $Ge_2H_6$; or (c) $(GeH_3)_2CH_2$, $GeH_3CH_3$ and $Ge_2H_6$, wherein in all cases, $Ge_2H_6$ is in excess.

In a second aspect, the invention provides semiconductor structures produced by the method of the first aspect.

In a third aspect, the invention provides semiconductor structures comprising a silicon-based semiconductor substrate, and a Ge layer formed directly over the silicon-based semiconductor substrate, wherein the Ge layer has a threading dislocation density below $10^5/cm^2$.

In a fourth aspect, the invention provides methods for depositing a Ge layer on a substrate in a reaction chamber, comprising introducing into the chamber a gaseous precursor comprising an admixture of (a) $(GeH_3)_2CH_2$ and $Ge_2H_6$; (b) $GeH_3CH_3$ and $Ge_2H_6$; or (c) $(GeH_3)_2CH_2$, $GeH_3CH_3$ and $Ge_2H_6$, wherein in all cases, $Ge_2H_6$ is in excess under conditions whereby a layer comprising a Ge material is formed on the substrate.

In a fifth aspect, the invention provides compositions consisting essentially of $(GeH_3)_2CH_2$ and $Ge_2H_6$ in a ratio of between 1:10 and 1:30.

In a sixth aspect, the invention provides compositions consisting essentially of $GeH_3CH_3$ and $Ge_2H_6$ in a ratio of between 1:5 and 1:30.

In a seventh aspect, the invention provides compositions consisting essentially of $GeH_3CH_3$ and $(GeH_3)_2CH_2$ in a ratio of 1:5 to 1:30 with $Ge_2H_6$.

BRIEF DESCRIPTION OF THE DRAWINGS

FIG. 12b shows a schematic showing a fully coherent heterostructure comprised of the cubic Ge buffer (light gray squares), the tetragonally distorted SiGe interface (light and dark gray) and the tensile strained Si overlayer (dark gray).

DETAILED DESCRIPTION OF THE INVENTION

Figure 1:
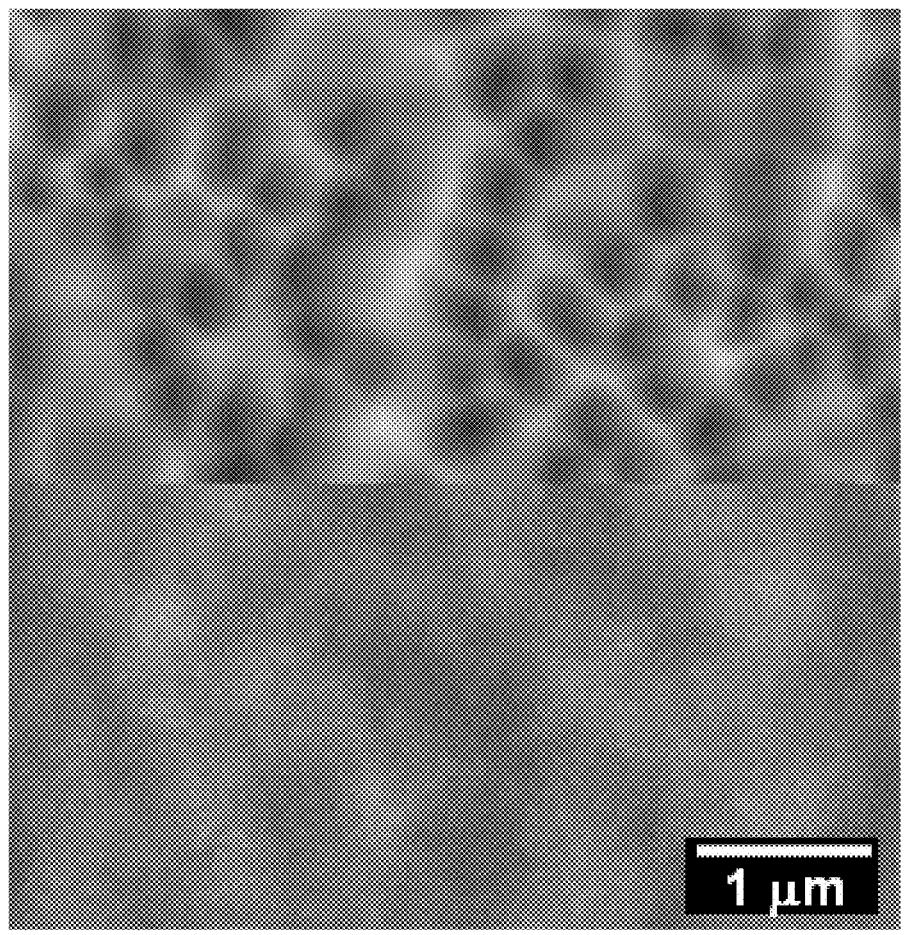
FIG. 1 shows an AFM of Ge films grown using pure $Ge_2H_6$ (top) and $(GeH_3)_2CH_2/Ge_2H_6$ in 1:15 ratio (bottom) at 420° C. indicating rough and smooth surface layer growth, respectively.

In one aspect, the present invention provides methods for preparing a semiconductor structure, comprising forming a Ge layer on a semiconductor substrate using an admixture of (a) $(GeH_3)_2CH_2$ and $Ge_2H_6$; (b) $GeH_3CH_3$ and $Ge_2H_6$; or (c) $(GeH_3)_2CH_2$, $GeH_3CH_3$ and $Ge_2H_6$, wherein in all cases, $Ge_2H_6$ is in excess. The methods of the present invention utilize a range of ratios of the recited components that are compatible for growth conditions that produce selective growth or blanket growth of pure Ge material with an essentially atomically flat surface morphology and device quality defect levels.

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate. It should be further understood that when a layer is referred to as being "directly on" another layer or substrate, the two layers are in direct contact with one another with no intervening layer. It should also be understood that when a layer is referred to as being "directly on" another layer or substrate, it may cover the entire layer or substrate, or a portion of the layer or substrate.

As used herein, the terms "substantially atomically planar" and "essentially atomically flat" means that the referenced surface has an RMS roughness value of less than about 1.0 nm as measured by atomic force microscopy according to methods familiar to one skilled in the art. Preferably, that the referenced surface has an RMS roughness value of less than about 0.75 nm or an RMS roughness value ranging from about 0.2 to 1.0 nm or about 0.3 to about 0.75 nm.

The methods of the invention can be used, for example, to produce semiconductor structures for applications in MOSFETs, HBTs, optoelectronic devices and III/V integration on Si. Under conditions disclosed herein we have deposited highly conformal Ge features with atomically flat surfaces and monocrystalline microstructures devoid of penetrating dislocations and threading defects. These are deposited on patterned wafers containing arrays of transistors. The Ge films were found to form readily on the Si exposed regions of the wafer such as the "source" and "drain" component of the device, while no deposition whatsoever was observed on insulator covered poly silicon areas or on device sections masked by nitride-based thin films. The low growth temperatures and the facile, epitaxy driven mechanism afforded by the methods disclosed herein promote strain free Ge to be grown directly on the mismatched Si substrate via compensating edge type dislocation confined to the plane of the heterojunction. The morphology and crystallinity of the films produced in experiments disclosed herein were characterized by high resolution electron microscopy, x-ray diffraction, atomic force microscopy and optical microscopy. Other deposition parameters that may be compatible with selective deposition include widely variable ratios of the $(GeH_3)_2CH_2$, $GeH_3CH_3$ and $Ge_2H_6$ reactants in which the $Ge_2H_6$ concentration in mixtures involving either one or both of the metal-organic compounds remains in excess.

The Ge layer can be formed as a single layer or a plurality of layers, including selective growth on patterned substrates and can be formed with a total thickness ranging between 40 nm-3 microns or more. For example, the Ge layer can be selectively deposited, utilizing the methods described previously, on a substrate having two or more surface materials, wherein the first surface material comprises an elemental semiconductor material or alloy, such as Si, Ge, or SiGe; the second surface material comprises an oxide, nitride, or oxynitride of an elemental semiconductor material, for example, $SiO_2$, $Si_3N_4$, SiON, Ge, $GeO_2$, GeON, or mixtures thereof; and wherein the Ge layer deposits selectively over the first surface material.

In further embodiments, the Ge layer has a density of threading defects of $10^5/cm^2$ or less, is virtually strain free, and/or has a substantially atomically planar surface morphology. The Ge layer can be deposited directly on the semiconductor substrate, obviating the need for thick buffer layers.

In certain embodiments, a Ge initiation layer can be formed on a substrate according to the methods described in the first aspect followed by changing the gas source to a second gas source essentially consisting of $Ge_2H_6$ to continue to deposit Ge on the Ge initiation layer to form the Ge layer on the substrate. Generally, the Ge initiation layer can have a thickness ranging from about 50 nm to about 1000 nm; preferably, the Ge initiation layer has a thickness ranging from about 50 nm to about 500 nm. In other embodiments, the Ge initiation layer has a thickness ranging from about 50 nm to about 250 nm. The Ge layers formed according to the preceding method can have a density of threading defects of $10^5/cm^2$ or less, can be virtually strain free, and/or can have a substantially atomically planar surface morphology. The Ge layer can have a thickness ranging from 50 nm to several microns, for example, up to 1-10 microns.

In other embodiments, the Ge layers formed according to the present methods of the invention are epitaxial. The term "epitaxial" as used herein, means that a material is crystalline and fully commensurate with the substrate. Preferably, epitaxial means that the material is monocrystalline, as defined herein. The term "monocrystalline" as used herein, means a solid in which the crystal lattice of the entire sample is continuous with no grain boundaries or very few grain boundaries, as is familiar to those skilled in the art.

The semiconductor substrate can be any substrate suitable for semiconductor use, including but not limited to silicon, silicon on insulator, $SiO_2$, and Si:C alloys. The semiconductor substrates can be n- or p-doped as is familiar to those skilled in the art; for example, n- or p-doped Si(100). In a preferred embodiment, the substrate comprises silicon, including but not limited to Si(100) and various buffer layers grown on Si. While the methods of the invention do not require a buffer layer, such buffer layers can be prepared with defect densities at least one order of magnitude lower than those possible in the prior art.

The methods comprise depositing the Ge layer on the semiconductor substrate, which may involve introducing into a reaction chamber a gaseous precursor comprising or consisting of an admixture of (a) $(GeH_3)_2CH_2$ and $Ge_2H_6$; (b) $GeH_3CH_3$ and $Ge_2H_6$; or (c) $(GeH_3)_2CH_2$, $GeH_3CH_3$ and $Ge_2H_6$, wherein in all cases, $Ge_2H_6$ is in excess. In one embodiment, the admixture can be an admixture of $(GeH_3)_2CH_2$ and $Ge_2H_6$ in a ratio of between 1:10 and 1:20. In another embodiment, the admixture can be an admixture of $GeH_3CH_3$ and $Ge_2H_6$ in a ratio of between 1:5 and 1:30. In another embodiment, the admixture can be an admixture of $GeH_3CH_3$ and $Ge_2H_6$ in a ratio of between 1:5 and 1:20. In yet another embodiment, the admixture can be an admixture of $GeH_3CH_3$ and $Ge_2H_6$ in a ratio of between 1:21 and 1:30. In yet another embodiment, the admixture can be an admixture of $GeH_3CH_3$ and $Ge_2H_6$ in a ratio of between 1:15 and 1:25.

In a further embodiment, the admixture can be an admixture of a combination of $(GeH_3)_2CH_2$ and $GeH_3CH_3$ at a 1:5 to 1:30 ratio with $Ge_2H_6$. In another further embodiment, the admixture can be an admixture of a combination of $(GeH_3)_2CH_2$ and $GeH_3CH_3$ at a 1:5 to 1:20 ratio with $Ge_2H_6$. In another further embodiment, the admixture can be an admixture of a combination of $(GeH_3)_2CH_2$ and $GeH_3CH_3$ at a 1:21 to 1:30 ratio with $Ge_2H_6$. In another further embodiment, the admixture can be an admixture of a combination of $(GeH_3)_2CH_2$ and $GeH_3CH_3$ at a 1:15 to 1:25 ratio with $Ge_2H_6$. In various non-limiting embodiments, the admixtures can be in ratios between 1:5 and 1:15, between 1:5 and 1:10, between 1:10 and 1:20, between 1:0 and 1:15, between 1:21 and 1:30, between 1:22 and 1:30, between 1:23 and 1:30, between 1:24 and 1:30, between 1:25 and 1:30, between 1:26 and 1:30, between 1:27 and 1:30, between 1:28 and 1:30, or between 1:29 and 1:30; or admixtures in ratios of 1:5, 1:6, 1:7, 1:8, 1:9; 1:10; 1:11; 1:12; 1:13; 1:14; 1:15.1:16, 1:17, 1:18, 1:19, 1:20, 1:21, 1:22, 1:23, 1:24, 1:25, 1:26, 1:27, 1:28, 1:29, or 1:30. In various embodiments, the step of introducing the gaseous precursor comprises introducing the gaseous precursors in substantially pure form in the absence of dilutants. In a further preferred embodiment, the step of introducing the gaseous precursor comprises introducing the gaseous precursors as a single gas mixture. In another embodiment, the step of introducing the gaseous precursor comprises introducing the gaseous precursor intermixed with an inert carrier gas. In this embodiment, the inert gas can be, for example, $H_2$ or $N_2$ or other carrier gases that are sufficiently inert under the deposition conditions and process application.

In these aspects, the gaseous precursor can be deposited by any suitable technique, including but not limited to gas source molecular beam epitaxy, chemical vapor deposition, plasma enhanced chemical vapor deposition, laser assisted chemical vapor deposition, and atomic layer deposition. In a further embodiment, the gaseous precursor is introduced by gas source molecular beam epitaxy at between at a temperature of between 350° C. and 450° C., more preferably between 350° C. and 430° C., and even more preferably between 350° to 420°, 360° to 430°, 360 to 420°, 360° to 400°, or 370° to 380°. Practical advantages associated with this low temperature/rapid growth process include (i) short deposition times compatible with preprocessed Si wafers, (ii) selective growth for application in high frequency devices, and (iii) negligible mass segregation of dopants, which is particularly critical for thin layers.

In various further embodiments, the gaseous precursor is introduced at a partial pressure between $10^{-8}$ Torr and 1000 Torr. In one embodiment, the gaseous precursor is introduced at between $10^{-7}$ Torr and $10^{-4}$ Torr gas source molecular beam epitaxy or low pressure CVD. In another embodiment, the gaseous precursor is introduced at between $10^{-7}$ Torr and $10^{-4}$ Torr for gas source molecular beam epitaxy. In yet another embodiment, the gaseous precursor is introduced at between $10^{-6}$ Torr and $10^{-5}$ Torr for gas source molecular beam epitaxy.

Further, in any of the preceding aspects and embodiments thereof, a second silicon-based layer can be deposited over the Ge layer. For example, a second silicon-based layer can be deposited over the Ge layer by contacting the same with a silane, such as trisilane, under conditions whereby the second silicon-based layer is deposited. In certain embodiments, the silicon-based layer comprises elemental Si; preferably, the silicon-based layer comprises monocrystalline Si. Such silicon-based layers can be deposited at unprecedented low temperatures, for example, about 400 to about 420° C., despite of the lower surface energy of the Ge template (i.e., the Ge layer), which is known to severely hinder such growth in conventional MBE-based processes. The silicon-based layers can have a thickness ranging from about 2 nm to about 1000 nm; preferably, the thickness ranges from about 2 nm to about 100 nm; more preferably, the thickness ranges from about 2 nm to about 50 nm; or from about 2 nm to about 25 nm.

In other embodiments, a high-k dielectric layer can be formed over the second Si-based layer according to methods familiar to those skilled in the art for depositing high-k dielectric layers over a Si-based layer (e.g., elemental Si or Si(100)). "High-k dielectrics" as used herein means a material having a dielectric constant greater than that of $SiO_2$. For example the high-k dielectric layer can comprise $SiN_x$, $Ta_2O_5$, $Al_2O_3$, HfSiON, $HfO_2$, HfSiO, $ZrO_2$, HfZrSiO ZrSiO, $La_2O_3$, $LaAlO_3$, PZT (lead zirconium titanate), and mixtures thereof.

In a further aspect, the present invention provides semiconductor structures made by the any one of the preceding methods of the invention.

In another aspect, the present invention provides semiconductor structures, comprising
a silicon-based semiconductor substrate, and
a Ge layer formed directly on the silicon-based semiconductor substrate, wherein the Ge layer has a threading dislocation density below $10^5/cm^2$.

All definitions and embodiments described above for the methods of the invention apply to the semiconductor structure aspects of the invention.

The semiconductor structure may further comprise other features as desired, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art or by use of specialty chemicals.

In a further embodiment, the semiconductor structure may further comprise varying quantities of carbon or tin, as desired for a given application. Inclusion of carbon or tin into the semiconductor substrates can be carried out by standard methods in the art. The carbon can be used to reduce the mobility of the dopants in the structure and more specifically boron. Incorporation of Sn can yield materials with novel optical properties such as direct emission and absorption leading to the formation of Si-based lasers and high sensitivity infrared photodetectors.

In another aspect, the present invention provides a composition, comprising or consisting of $(GeH_3)_2CH_2$ and $Ge_2H_6$ in a ratio of between 1:10 and 1:30. In one embodiment, the present invention provides a composition, comprising or consisting of $(GeH_3)_2CH_2$ and $Ge_2H_6$ in a ratio of between 1:10 and 1:20. In another embodiment, the present invention provides a composition, comprising or consisting of $(GeH_3)_2CH_2$ and $Ge_2H_6$ in a ratio of between 1:21 and 1:30. In another embodiment, the present invention provides a composition, comprising or consisting of $(GeH_3)_2CH_2$ and $Ge_2H_6$ in a ratio of between 1:15 and 1:25. In various non-limiting embodiments, the composition is present in ratios of 1:10 to 1:19; 1:10 to 1:18; 1:10 to 1:17; 1:10 to 1:16; 1:10 to 1:15; 1:21 to 1:30; 1:22 to 1:30; 1:23 to 1:30; 1:24 to 1:30; 1:25 to 1:30; 1:26 to 1:30, 1:27 to 1:30; 1:28 to 1:30; or 1:29 to 1:30; or in ratios of 1:10, 1:11, 1:12, 1:13, 1:14, 1:15, 1:16, 1:17, 1:18, 1:19, or 1:20. In a further embodiment of all of these embodiments, the composition is present in a gaseous form.

In another aspect, the present invention provides a composition, comprising or consisting of $GeH_3CH_3$ and $Ge_2H_6$ in a ratio of between 1:5 and 1:30. In one embodiment, the present invention provides a composition, comprising or consisting of $GeH_3CH_3$ and $Ge_2H_6$ in a ratio of between 1:5 and 1:20. In one embodiment, the present invention provides a composition, comprising or consisting of $GeH_3CH_3$ and $Ge_2H_6$ in a ratio of between 1:21 and 1:30. In another embodiment, the present invention provides a composition, comprising or consisting of GeH$_3$CH$_3$ and Ge$_2$H$_6$ in a ratio of between 1:15 and 1:25. In various non-limiting embodiments, the composition is present in ratios of 1:5 to 1:19; 1:5 to 1:18; 1:5 to 1:17; 1:5 to 1:16; 1:5 to 1:15; 1:5 to 1:14; 1:5 to 1:13; 1:5 to 1:12; 1:5 to 1:11; 1:5 to 1:10; 1:21 to 1:30; 1:22 to 1:30; 1:23 to 1:30; 1:24 to 1:30; 1:25 to 1:30, 1:26 to 1:30, 1:27 to 1:30; 1:28 to 1:30; or 1:29 to 1:30; or in ratios of 1:5, 1:6, 1:7. 1:8, 1:9, 1:10, 1:11, 1:12, 1:13, 1:14, 1:15, 1:16, 1:17, 1:18, 1:19, 1:20, 1:21, 1:22, 1:23, 1:24, 1:25, 1:26, 1:27, 1:28, 1:29, or 1:30. In a further embodiment of all of these embodiments, the composition is present in a gaseous form.

In another aspect, the present invention provides a composition, comprising or consisting of GeH$_3$CH$_3$ and (GeH$_3$)$_2$CH$_2$ in a ratio of 1:5 to 1:30 with Ge$_2$H$_6$. In one embodiment, the present invention provides a composition, comprising or consisting of GeH$_3$CH$_3$ and (GeH$_3$)$_2$CH$_2$ in a ratio of 1:5 to 1:20 with Ge$_2$H$_6$. In one embodiment, the present invention provides a composition, comprising or consisting of GeH$_3$CH$_3$ and (GeH$_3$)$_2$CH$_2$ in a ratio of 1:21 to 1:30 with Ge$_2$H$_6$. In another embodiment, the present invention provides a composition, comprising or consisting of GeH$_3$CH$_3$ and (GeH$_3$)$_2$CH$_2$ in a ratio of 1:15 to 1:25 with Ge$_2$H$_6$. In various non-limiting embodiments, the composition is present in ratios of 1:5 to 1:19; 1:5 to 1:18; 1:5 to 1:17; 1:5 to 1:16; 1:5 to 1:15; 1:5 to 1:14; 1:5 to 1:13; 1:5 to 1:12; 1:5 to 1:11; 1:5 to 1:10; 1:21 to 1:30; 1:22 to 1:30; 1:23 to 1:30; 1:24 to 1:30; 1:25 to 1:30; 1:26 to 1:30, 1:27 to 1:30; 1:28 to 1:30; or 1:29 to 1:30; or in ratios of 1:5, 1:6, 1:7. 1:8, 1:9, 1:10, 1:11, 1:12, 1:13, 1:14, 1:15, 1:16, 1:17, 1:18, 1:19, 1:20, 1:21, 1:22, 1:23, 1:24, 1:25, 1:26, 1:27, 1:28, 1:29, or 1:30. In a further embodiment of all of these embodiments, the composition is present in a gaseous form.

EXAMPLES

Example 1

General Ge Deposition Procedures

Ge films were grown directly on Si by gas source molecular beam epitaxy (GS-MBE) at 350-420° C. and 5×10$^{-5}$ Torr using admixtures of either (GeH$_3$)$_2$CH$_2$ or GeH$_3$CH$_3$ and Ge$_2$H$_6$ at optimized molar ratios. The reaction mixture was prepared prior to each deposition by combining the pure compounds in a 100 mL vacuum flask. The total pressure was 115 Torr, which is well below the vapor pressure of (GeH$_3$)$_2$CH$_2$ (248 Torr at 25° C.) or GeH$_3$CH$_3$ which is a gas at room temperature. The flask was connected to a gas injection manifold which was pumped to ~10$^{-8}$ Torr on the gas source MBE chamber. A boron doped (1-10 Ω-cm), Si(100) wafer was RCA cleaned and then cleaved to a 1 cm$^2$ size that fits the dimensions of the sample stage. Each substrate was sonicated in methanol for 5 minutes, dried under a stream of purified N$_2$, and inserted through a load lock into the MBE chamber at a base pressure of 8×10$^{-10}$ Torr. The sample was then heated at 600° C. under UHV to remove surface contaminants until the pressure of the chamber was restored to background levels. The sample was subsequently flashed 10 times to 1000° C. for 1 second to remove any remaining contaminants, and then flashed again at 1150° C. for 5 times to remove the native oxide from the silicon. To commence growth, the wafer was heated to 350-420° C. as measured by single-color pyrometer and the temperature was then allowed to stabilize for 5 minutes. The heating was performed by passing direct current though the samples. The precursor mixture was introduced into the chamber at a flow rate of approximately 0.08 sccm through a manual leak valve. The pressure was maintained constant (5×10$^{-5}$ Torr) during growth via dynamic pumping using a corrosion resistant turbomolecular pump. The typical deposition times were 0.5-5 hours depending on the desired film thickness. Under these conditions Ge on Si films were produce with thicknesses in the range of 0.30-3 μm at rates approaching 10 nm per minute.

Example 2

Structural and Optical Characterization Methodology

The samples were extensively characterized for morphology, microstructure, purity and crystallographic properties by atomic force microscopy (AFM), Rutherford backscattering (RBS), secondary ion mass spectrometry (SIMS), cross sectional transmission electron microscopy (XTEM) and high resolution x-ray diffraction (XRD). The threading defects densities were estimated using an etch pit technique (EPD) (see, Luan et al, supra).

Raman studies were carried out at room temperature using several laser lines. The laser beam was focused on the sample using a 100× objective. Typical incident powers were in the 1-2 mW range. The scattered light was dispersed with either an Acton 27.5 cm or an Acton 50.0 cm spectrometer equipped with 1800 and 2400 grooves/mm gratings and Charge Coupled Device detectors. Photoreflectance experiments were performed at room and cryogenic temperatures using a laser wavelength of 514.5 nm. The modulating laser beam was chopped at 1 kHz. Light from a quartz tungsten halogen source was reflected off the sample, dispersed through the Acton spectrometer and focused on an InGaAs detector. The AC component of the signal was extracted using standard lock-in techniques. The same setup minus the halogen lamp was used for photoluminescence experiments.

Example 3

Results and Discussion

The present invention involves the design and application of purpose built molecular precursors targeted to tailor the surface reactions at the growth front. This is achieved by the deposition of highly reactive compounds such as (GeH$_3$)$_2$CH$_2$ digermylmethane or CH$_3$GeH$_3$ with built-in "pseudo-surfactant" capabilities intended to promote layer-by-layer growth of smooth, continuous and relaxed Ge films devoid of deleterious threading dislocations. In the initial stages of growth, the deposition of the molecules proceeds via formation of edge dislocations, which heal the interfacial strain associated with the pseudomorphic growth and suppress the propagation of dislocation cores throughout the layer. During subsequent growth, the compound facilitates a self organized assembly of thick films with atomically flat and defect free surfaces. In the case of (GeH$_3$)$_2$CH$_2$, the driving force for its deposition reactions is the facile elimination of robust CH$_4$ byproducts. Growth of Ge films using the CH$_3$GeH$_3$ compound proceeds via a similar mechanism and by the reaction decomposition pathway of Eq. (1):

$$GeH_3CH_3 \rightarrow Ge + H_2 + CH_4 \qquad (1)$$

It is well-known that under the temperature/pressure parameters described above, Ge film growth using pure digermane proceeds via the classic Stranski-Krastanov process by formation and coalescence of three dimensional islands, ultimately leading to the creation of rough films dominated by surface undulations. Collectively, our experiments demonstrate that small concentrations of the (GeH$_3$)$_2$CH$_2$, GeH$_3$CH$_3$ organic additives can profoundly alter this conventional film growth mechanism leading to the assembly of flat, strain-free films with record low defect densities. The highest quality films are obtained for optimum concentration ratios of 1:10 for GeH$_3$CH$_3$ and 1:15 for (GeH$_3$)$_2$CH$_2$ in digermane.

Example 3a

Strain Free Ge Growth Via (GeH$_3$)$_2$CH$_2$

At the onset of the deposition experiments we systematically varied the substrate temperature and the reactant concentration in the gaseous mixture to determine the optimum growth parameters and the most favorable surface reaction conditions that would yield the best possible film quality in terms of purity, morphology and microstructure.

We found that the ratio of the (GeH$_3$)$_2$CH$_2$/Ge$_2$H$_6$ precursor flux had a profound effect on all of these material properties. For example, growth using molar ratios in the range form 1:2 to 1:10 produced discontinuous layers with rough surfaces dominated by islands of variable size and shape. These samples were analyzed by RBS carbon resonance profiles, which revealed a significant carbon contamination throughout the layers, primarily in samples grown using molecular ratio of 1:2 and 1:5. This indicates that in such highly concentrated mixtures the "pseudosurfactant" reaction mechanism of the (GeH$_3$)$_2$CH$_2$ compound, which is designed to proceed with complete elimination of the CH$_2$ fragment as CH$_4$, is compromised, resulting in the incorporation of residual C—H impurities. Further reduction of the compound molar ratio in the range of 1:10-1:15 yielded higher-purity, carbon-free films, with atomically smooth surfaces (AFM RMS values of 0.3 nm) and thickness up to ~3 μm. Under these conditions the growth rate and film thickness were found to depend sensitively on the growth temperature. More specifically, between 430 and 350° C. the nominal rates and corresponding thicknesses were 10-5 nm/min and 3-0.8 μm, respectively, and no discernible growth was observed below 350° C. It is interesting to note that deposition reactions in the range of 450-470° C. produced films that were contaminated with carbon at levels as high as several atomic percent, and exhibited relatively rough surfaces with RMS values or 3-5 nm. This is consistent with previous UHV-CVD experiments of the related GeH$_3$CH$_3$ compound, which yielded similar carbon incorporations.

Finally we also conducted control experiments using pure Ge$_2$H$_6$ (in complete absence of (GeH$_3$)$_2$CH$_2$ from the mixture, i.e, 0:1 ratio), which produced films dominated by surface undulations exhibiting extremely high RMS roughness, as expected. Variation in deposition conditions such as temperature, pressure and compound flux rate did not yield any improvement in the film quality and all layers produced via this method were defective and rough as determined by XTEM and AFM studies. For example AFM scans of Ge films with 450 nm thickness grown at 420° C. via pure Ge$_2$H$_6$, exhibited an RMS roughness of ~30 nm for 5×5 μm$^2$ areas. In contrast, the roughness for films grown using the 1:15 precursor ratio was found to be 0.2-0.3 nm, which is comparable with atomic step heights on Si. These results collectively indicate that the "pseudosurfactant" properties of (GeH$_3$)$_2$CH$_2$ are enhanced, and the film quality is optimized, for reactant ratios close to 1:15 and growth temperatures in the 350-430° C. range.

AFM studies indicate that of all Ge samples grown under these conditions possess atomically flat surfaces. FIG. 1 (top) shows a tapping mode image of a 400 nm Ge film grown at 420° C. using the optimal 1:15 ratio exhibiting an RMS of ~0.21 nm for 5×5 μm$^2$ areas. Note that a Ge film of comparable thickness grown at the same conditions using pure Ge$_2$H$_6$ (FIG. 1 (bottom)) shows a high roughness of ~16 nm. Random and channeling RBS including carbon resonance indicate pure Ge materials perfectly aligned with the substrate. In most samples the ratio of the aligned versus the random peak heights ($\chi_{min}$), which measures the degree of crystallinity, decreases from 10% at the interface to 5% across the layer indicating a dramatic reduction in dislocation density. HR-XRD scans including (224) and (004) reciprocal space maps were used to determine the average unit cell dimensions parallel (a) and perpendicular (c) to the interface plane. The results showed that all Ge films are virtually strain free which is consistent with our observation of atomically smooth surfaces. We note that several thin samples (<80 nm) revealed a slight tensile strain which is as high as −0.04% at room temperature (a topic of ongoing studies). XRD also indicated nominal mosaics spreads of ~0.14 degrees and lateral correlations (grain size) of ~0.25 μm.

Figure 2:
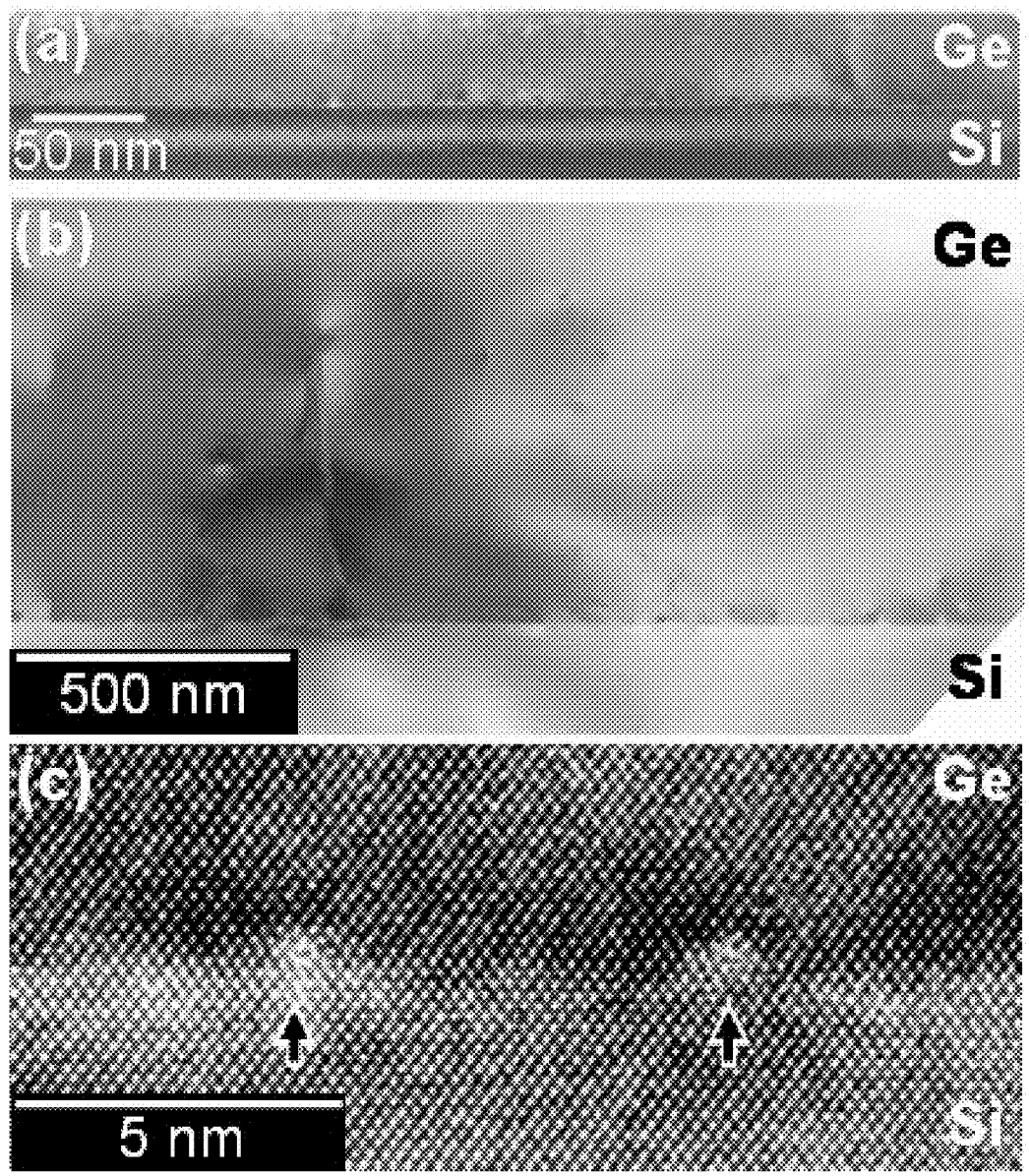
FIG. 2 shows an (a) and (b) Diffraction contrast micrographs of Ge layers with 50 and 800 nm thickness, respectively; Note the lack of penetrating defects and the very smooth surface morphologies in both cases (c) HR XTEM image of the Ge/Si(100) hetero-interface. where the arrows indicate the position of the edge dislocations.

XTEM in phase-contrast and Z-contrast modes was extensively used to characterize the microstructure and morphology of the films. The bright field images revealed essentially no penetrating threading defects over an extended lateral range of 2 μm, independently of the layer thickness (50-850 nm) (FIG. 2). The film surface in all cases was atomically flat. High resolution images in [110] projection near the Ge/Si heterojunction indicated sharp, commensurate interfaces and revealed the presence of periodic edge dislocations confined to the plane of the interface. The arrows in FIG. 2(c) show the location of well-separated stress-relieving dislocation cores. The distance between cores corresponds to an alignment of twenty nine Si rows with every twenty eight Ge rows, which closely matches the ratio of the lattice constants between Si and Ge [5.657 Å(Ge)/5.431 Å(Si)=1.04 and 29/28=1.035]. This alignment perfectly accommodates the lattice mismatch between Si(100) and Ge(100) leading to layer-by-layer growth of stress free films with ~0.2 nm RMS roughness. The edge dislocations can also be seen in the Z-contrast high resolution images (not shown) which further confirm the presence of a well defined interface between Si and Ge. Electron energy loss nanoanalysis across the interface corroborates this interpretation of the Z-contrast results and confirms a chemically abrupt transition between Si and Ge, indicating no elemental intermixing and no measurable levels of impurities above the usual background.

SIMS was routinely used to determine the Ge, C and O atomic profiles of representative samples with variable thicknesses grown at 350-420° C. In all cases we find that the layers consist of high purity Ge. More importantly, the SIMS profiles show that the C content is at the detection limit, below $3 \times 10^{17}$ cm$^{-3}$ (bottom of FIG. 3). In view of the relatively high concentration level of C in the reaction mixture (~3 at % with respect to Ge) this finding confirms the complete elimination of CH$_4$ from the (GeH$_3$)$_2$CH$_2$ molecules, as expected according to the reaction: (GeH$_3$)$_2$CH$_2$ (gas)→CH$_4$ (gas)+2 Ge (solid)+2 H$_2$ (gas). We note that the O content through the film thickness was also at background levels. Minor C and O contamination peaks, commonly observed in CVD grown materials can be also seen at the Ge/Si interface in our samples. These C and O signatures vary from sample to sample indicating that C (in particular) may not be related to any measurable decomposition of (GeH$_3$)$_2$CH$_2$ in the vicinity of the interface. However, some C detected at impurity level concentrations could be due to side reactions of the precursor with the reactive Si surface. Nevertheless, the fact that oxygen levels track those of carbon in all of our samples cannot be explained in terms of the precursor decomposition on the surface.

Figure 4:
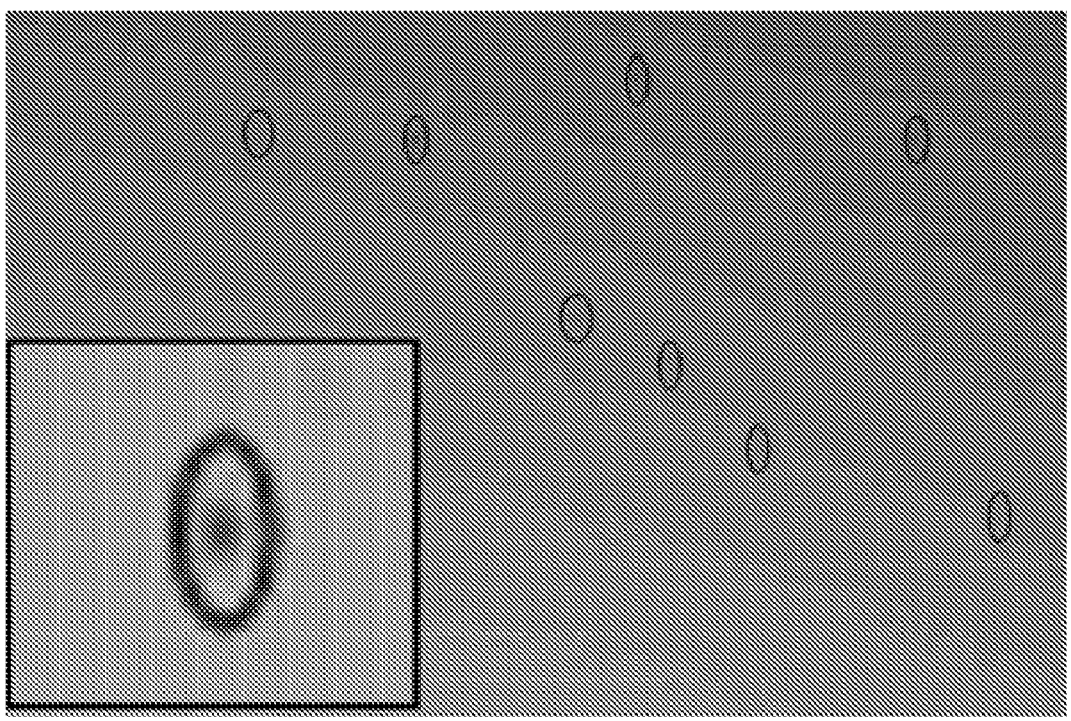
FIG. 4 is an optical image of an etched Ge surface showing the location of penetrating defects (marked by oval shape ring). Inset illustrates an enlarged site of a typical defect, seen as a dark spot inside the ring.
Figure 5:
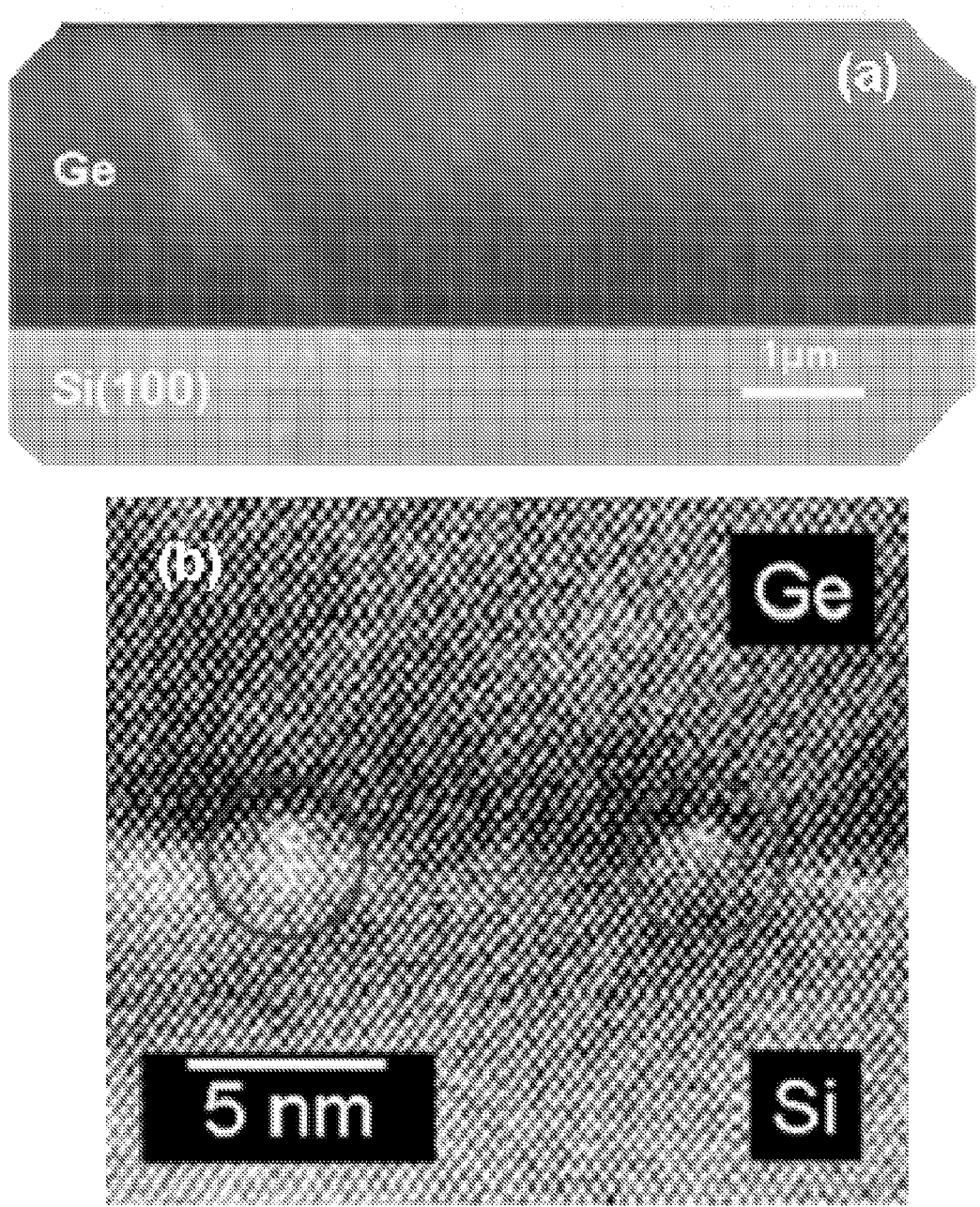
FIG. 5 shows an XTEM of a Ge film grown on Si(100) at 420° C. (a) Phase contrast micrograph showing a 2.5 µm film thickness and a perfectly flat surface. (b) high-resolution image of the heteroepitaxial interface showing the location of Lomer defects (circles).

An etch pit density technique was used to estimate the concentration of threading dislocations in selected samples with thickness close to 0.8 µm. These were etched for typically 200 sec at an average rate of ~2 nm/sec using a mixture of 700 mL $CH_3COOH$, 70 mL $HNO_3$, 4 mL HF and 270 mg $I_2$. The resulting pits were counted from images obtained by an optical microscope (FIG. 4). The images showed no dislocations within the first 300-400 nm over areas of 85×64 µm. At 500 nm the detectable dislocation densities were found to be below ~$10^5$ $cm^{-2}$, and this value increased abruptly towards the interface region. This is consistent with XTEM images that show no threading defects throughout the upper portion of the film but a substantial "pile up" near the interface region. These images also showed atomically flat film surfaces and confirmed the RBS measured thicknesses which ranged from 0.50-2.5 µm in most samples (FIG. 5a). The high resolution micrographs revealed a periodic array of Lomer-type edge dislocations confined to the interface plane (FIG. 5b). These likely form in the early stages of growth and provide the necessary strain relief between the highly mismatched substrate and epilayer. Atomic resolution Z-contrast images (not shown) confirmed the presence of edge dislocations and revealed an abrupt transition between the substrate and the epilayer. The interface roughness is less than 1 nm, which appears to be similar to that of the underlying substrate. Electron energy loss nanoanalysis of the interface region indicated no elemental intermixing on the subnanometer scale. The intediffusion at these low temperatures is therefore suppressed, leading to atomically sharp interfaces. No measurable levels of impurities above the usual background levels were detected by EELS.

Figure 6:
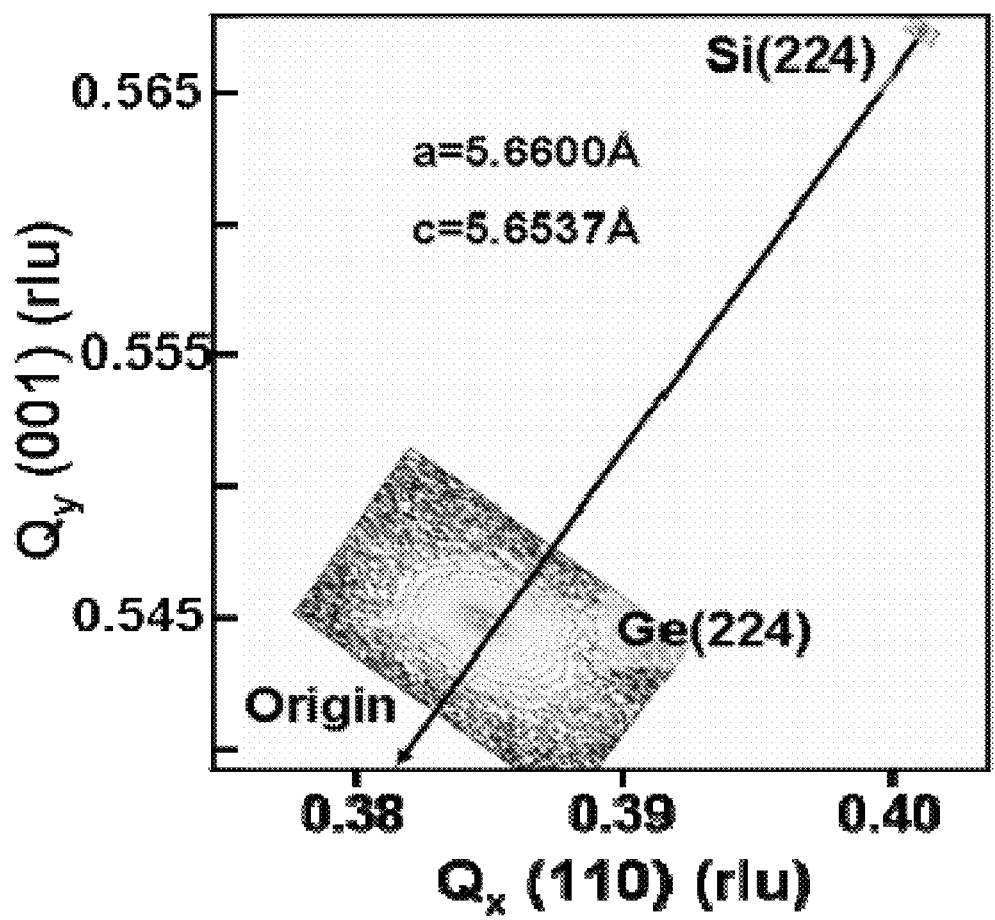
FIG. 6 shows (224) RSM plots of the Ge film shown in FIG. 4 and Si substrate. The relaxation line passes near the center of the Ge peak indicating that the material is almost strain-free. This is consistent with the nearly equal values of the (a) plane and (c) lattice constants (shown inset) derived from (224) and (004) Bragg reflections.
Figure 10:
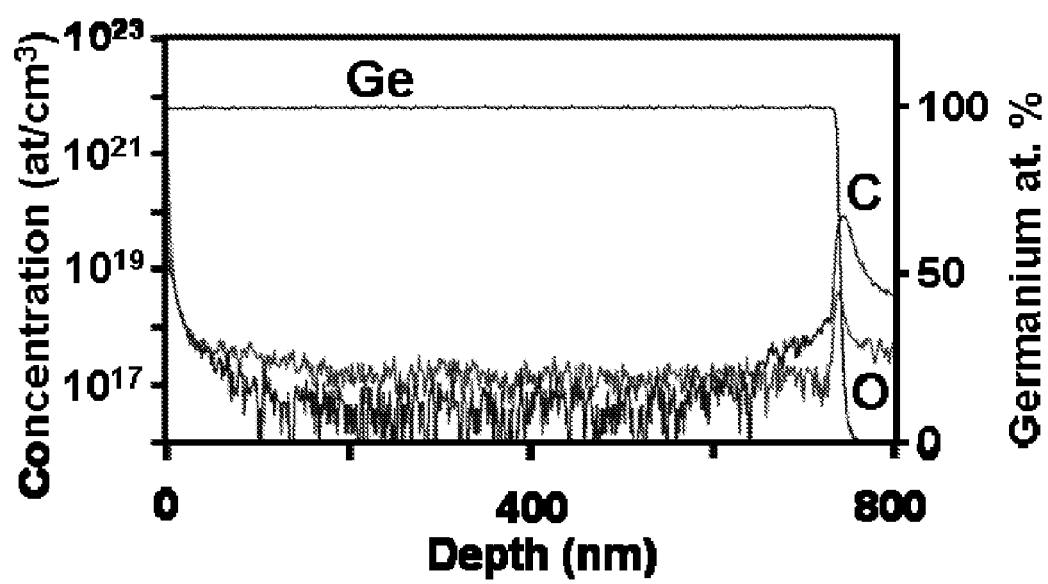
FIG. 10 is a SIMS profile of an ~700 nm Ge film deposited using $GeH_3CH_3/Ge_2H_6$ in 1:10 ratio at 360° C. The data show no measurable C contamination across the layer. Impurity level C and O peaks are observed at the sharp Ge/Si interface.

XRD reciprocal space maps (RSM) in the vicinity of the (004) and (224) reflections were obtained to precisely determine the in-plane (a) and out-of-plane (c) lattice constants for the films. The data showed that the Ge films grown by this technique were fully relaxed. This result is consistent with the atomically flat surface morphology and suggests that a layer-by-layer growth mechanism must be in operation in the absence of strain. The relaxation in the samples was so complete that several of the films showed a slight tensile strain upon cooling to room temperature, presumably due to the thermal mismatch of Ge with the underlying Si substrate. The (224) RMS plot of a sample with ~2.5 µm thickness (FIG. 6) shows that the layer possesses a residual tensile strain. The full width at half maximum of the (004) Bragg reflection for this sample is approximately 400 arcseconds and the mosaic spread derived from the (224) peak is 250 arcseconds, indicating slight tilt between grains. Secondary ion mass spectroscopy (SIMS) was also performed on selected samples produced across the entire 350-430° C. temperature regime. Samples grown at 420° C. show a carbon content of ~$3×10^{16}$ atoms per $cm^3$ across the layer, which is below the noise level of the SIMS measurement (see, Wistey, et al., J. *Appl. Phys. Lett.* 2007, 90(8), 082108). The oxygen content in these films was similarly low and was dominated by the background level in the SIMS apparatus. We note, however that at the Ge/Si interface there is a sharp increase in the C and O concentrations to levels as high as $10^{19}$ $cm^{-3}$, as indicated by the presence of two distinct peaks corresponding to these elements. Similar features are commonly observed in CVD-grown materials and they are typically associated with surface contamination. FIG. 10 at a later section shows similar interface signatures for the C, and O impurities.

Raman, Photoreflectance and Photoluminescence of Ge/Si (100)

Figure 7:
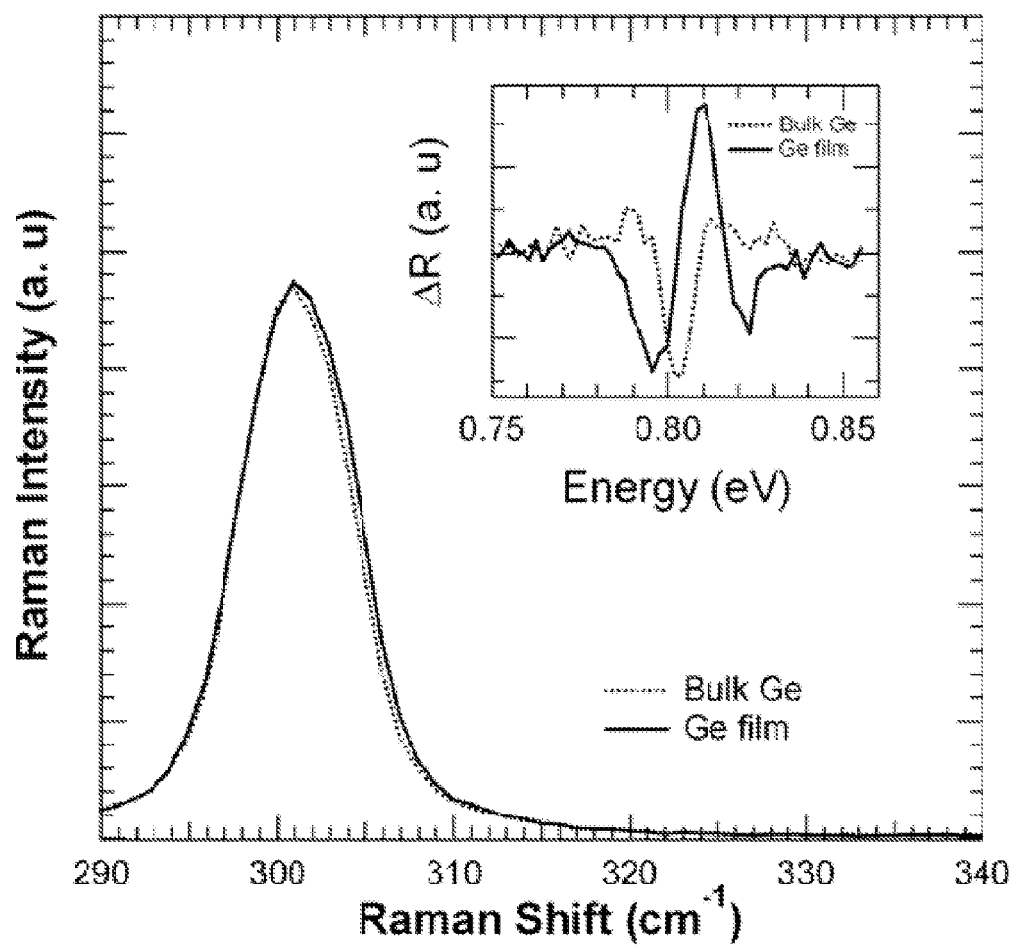
FIG. 7 is a Raman spectrum of a 650 nm Ge film grown on Si (solid line) compared with that of a bulk Ge substrate (dotted line). The inset shows room temperature photoreflectance spectra for both samples, using the same convention for the lines. The measured energy range corresponds to the direct gap of Ge.
Figure 8:
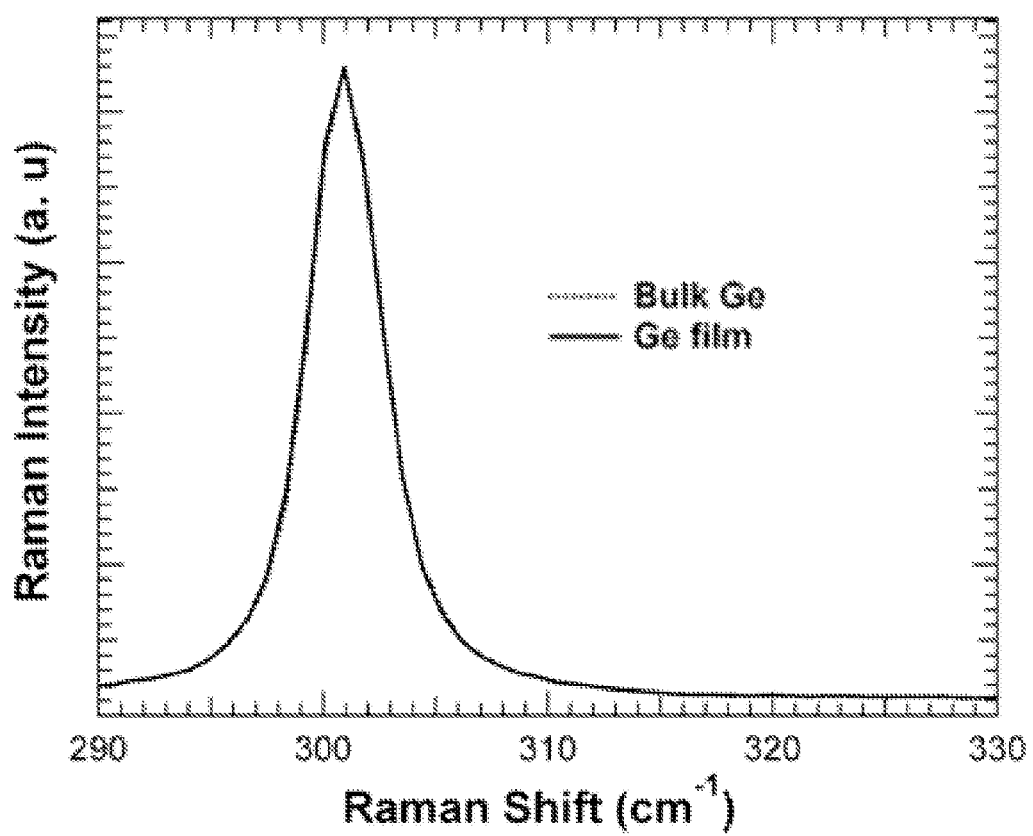
FIG. 8 is a Raman spectrum of a 500 nm Ge film on Si (solid line) compared to that of bulk Ge (dotted line). The overlap between the two spectra is perfect.

FIG. 7 compares the room temperature Raman spectrum of a 650 nm thick Ge film with that of a reference Ge bulk substrate, obtained with 532 nm excitation. For this wavelength, the penetration depth of light in Ge is approximately 18 nm (so that the Raman signal originates mainly from the first 9 nm). According to the X-ray data, the film strain is relaxed. Since, as mentioned above, the only allowed first-order Raman peak corresponds to the highest frequency vibration in the perfect crystal, the presence of defects should shift and broaden the line toward lower Raman shifts. In our case, the film Raman spectrum is very similar to that of the Ge bulk substrate, confirming the high quality of our film. A very small frequency upshift is observed, which we assign to a residual amount of compressive strain. Using Eq. (1), we estimate that this compressive strain is 0.04%. It is apparent from FIG. 7 that this is close to the detection limit of the Raman technique and within the error of the x-ray measurements. The inset in FIG. 7 shows room temperature photoreflectance results in the spectral region corresponding to the lowest direct gap $E_0$. We fit the spectra with standard expressions for critical point features, and for the reference Ge substrate we find $E_0$=0.803(1) eV. For the Ge film, the transition is slightly shifted to 0.806(1) eV, and the broadening parameter is virtually identical to that of bulk Ge. Interestingly, if we use standard deformation potential theory to calculate the strain shift of the band gap for 0.04% compressive strain, we find that the heavy-hole band gap increases by 3 meV, in agreement with the observed shift. Thus the photoreflectance measurement is consistent with the Raman result and both confirm the high quality of the Ge-film and the very small magnitude of the residual strain. Moreover, the example discussed in FIG. 7 represents in a certain sense a "worst-case" scenario: in other samples we find absolutely no discernible difference between the Raman spectrum of the Ge-film and that of the Ge-substrate. In FIG. 8 we show data for one such sample. Its Raman spectrum essentially overlaps the Raman spectrum of bulk Ge. This sample also shows a weak but clearly observable photoluminescence peak upon excitation with 250 mW of 488 nm light. The peak maximum at 0.745 eV is very close to the position of the indirect edge in pure Ge.

Example 3b

Strain-Free Depositions Via $GeH_3CH_3$

The $GeH_3CH_3$, analog of $(GeH_3)_2CH_2$, was also explored as a potentially practical source to grow Ge films on Si at low temperatures between 360 and 420° C. The experiments were performed at constant deposition pressure of $5×10^{-5}$ Torr using suitable mixtures of the compound with $Ge_2H_6$ at molar concentration ranging mostly from 1:5 to 1:15. The substrate preparation and sample handling procedures were essentially identical to those described above for the experiments involving $(GeH_3)_2CH_2$.

Preliminary depositions using a dilute reactant ratio of 1:20, $GeH_3CH_3/Ge_2H_6$ produced crystalline but visibly rough layers exhibiting a cloudy surface appearance. AFM indicated an RMS roughness of 8-9 nm and revealed a surface morphology dominated by a network of two-dimensional terraces with variable size, shape and orientation. This is in stark contrast to the usual three-dimensional islands or surface ripples typically observed in conventional Ge growth at this temperature. To further improve the film morphology we increased the reactant molar ratio to the 1:15 and performed a series of depositions at 360, 380, 400 and 420° C. using this mixture. The resultant films displayed a smooth appearance indistinguishable from that of the underlying substrate, indicating that the samples were flat and crystalline.

Characterizations by RBS including ion channeling indicated highly aligned layers in perfect commensuration with the substrate. In most samples the ratio of the channeled versus the random peak heights ($\chi_{min}$), which measures the degree of crystallinity, decreases from 10% at the interface to 4%, across the layer indicating a dramatic reduction in dislocation density (the 4% value represents the theoretical limit in pure Si). RBS carbon resonance experiments were used to confirm the absence of carbon impurities within the bulk of the material. The corresponding depth profiles using a series of ion beam energies with variable penetration depths did not reveal any measurable carbon contamination within the uncertainty of the measurement (less than 0.5 at. %). The RBS derived thicknesses for the Ge/Si(100) layers varied from 400 nm to 600 nm with increasing temperature from 360-420° C. with a concomitant increase in growth rate from 5 to 10 nm/min., respectively.

Figure 9:
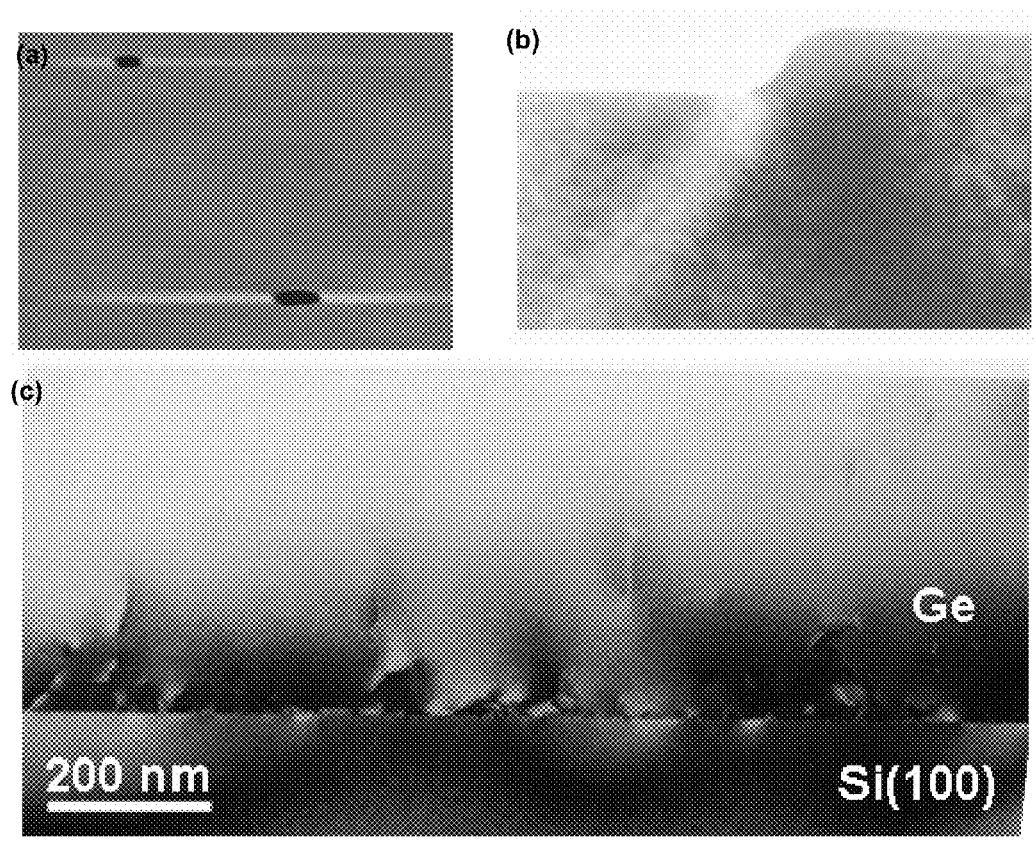
FIG. 9 shows AFM and XTEM images of a Ge sample containing surface depressions. (a) AFM image (1 µm×0.8 µm) in the vicinity of two representative "match box" depressions. (b) Diffraction contrast micrograph showing the cross-sectional morphology for one of these features, including one vertical edge and a section of the horizontal bottom surface (c) XTEM image of the sample showing an atomically smooth layer devoid of threading defects penetrating to the surface within the field of view.

Among these samples the AFM examinations of films deposited at 400 and 420° C. revealed flat surface morphology with an RMS roughness of 0.2 nm. However, the AFM images also revealed that approximately 5% of the sample surface was covered by an array of perfectly rectangular nanoscale depressions (FIG. 9). XTEM micrographs indicate that their lateral and vertical dimensions are 100-150 and 10-15 nm, respectively, corroborating the surface patterns and morphologies observed by AFM. In addition the horizontal surface and vertical edges were perfectly planar and approximately orthogonal, indicating that these depressions have a parallelepiped "match-box"-like shape. The low magnification XTEM images also revealed an average layer thickness of 400 nm and an overall flat surface morphology interrupted by the occasional presence of the depressions in these samples. Finally, we note that by lowering the sample growth temperature into the 360-400° C. range produced samples in which the density of these depressions could be reduced to an arbitrarily low value, but not entirely eliminated.

Accordingly, we further increased the concentration of GeH$_3$CH$_3$ beyond the 1:15 ratio to determine its effect on the surface properties and film growth rates. Depositions using 1:10 mixtures at temperatures near 420° C. produced thick films exhibiting substantial concentrations of the "match-box" depressions. However, for this reactant stoichiometry lowering the temperature to 360° C. yielded perfectly flat films completely devoid of these features. The growth rate in this case (GeH$_3$CH$_3$ at 360° C.) is 5 nm/minute, which is essentially identical to that obtained from the deposition of (GeH$_3$)$_2$CH$_2$ at 420° C. Thus the GeH$_3$CH$_3$ compound is the best candidate to date for viable low temperature Ge growth compatible with selective area applications. Depositions using 1:5 mixtures produced comparable surface morphologies; however the growth rates were significantly reduced to levels below 3 nm per minute. In the limiting case of using the pure GeH$_3$CH$_3$ compound as the sole reactant (1:0 molar ratio) we obtained negligible film growth. This indicates that the Ge films in these reactions must be generated by the facile surface dissociation of the highly reactive (GeH$_3$)$_2$ species and the role of the organic analog is to catalyze or facilitate layer-by-layer growth. To confirm the absence of carbon in the bulk of the film we analyzed selected samples by SIMS compositional profiles. The data showed that all materials were essentially free of carbon and displayed very similar C and O profiles to those observed previously in the related growth studies using the (GeH$_3$)$_2$CH$_2$ compound.

FIG. 10 shows a typical profile for a sample deposited at 360° C. using a 1:10 ratio of GeH$_3$CH$_3$ in Ge$_2$H$_6$. Note that the carbon content remains below the detection limit (~10$^{16}$ at/cm$^3$) throughout the entire thickness of the sample, with a sharp rise to a value <10$^{20}$ at/cm$^3$ at the interface. The C and O profiles found here are also essentially identical to those observed in our previous growth studies using the (GeH$_3$)$_2$CH$_2$ compound (see, Wistey et al, supra). These levels are in fact quite typical for CVD materials grown under these conditions. Thus, the carbon enhancement near the interface is not likely associated with the reactivity of the particular precursor employed.

It is interesting to note that Ge:C films 30 nm thick have been demonstrated in high temperature (<450° C.) depositions of GeH$_3$CH$_3$ by UHV-CVD. In this case the intentional incorporation of carbon at the 1% level purportedly produces surface roughness of ~3 Å and low defect densities of 3×10$^5$ cm$^{-2}$ (see, Kelly et al., *Appl. Phys. Lett.* 2006, 88, 152101). SIMS profiles showed that the carbon segregates towards upper/lower portion of the films near the surface/interface regions. The layers are slightly compressed with a net relaxation of ~78% and are typically too thin for optical applications but could prove useful for Ge-channel MOSFETs (see, Kelly et al., *Semicond. Sci. Technol.* 2007, 22, S204). Our deposition experiments using GeH$_3$CH$_3$ were conducted on a single-stage wafer configuration at significantly lower temperatures (360° C.) which precluded any the side reactions which might lead to carbon contamination.

Example 3c

Ge Depositions Via Initiation Layers

To confirm that (GeH$_3$)$_2$CH$_2$ does not deposit C during growth we conducted two control experiments designed to verify that carbon does not migrate to the surface in a typical surfactant fashion. In both cases an initiation Ge layer of ~250 nm was grown directly on the Si substrate using the 1:15 reactant ratio, as described above.

In a first experiment, a second growth step is then performed in situ immediately after completion of the first layer in order to maintain an uninterrupted growth environment and—more importantly—an unperturbed "as grown" Ge surface.

In the second experiment, an overlayer of pure Ge was deposited on top of the initiation layer of Ge on Si that had been prepared as described previous. After deposition of the initiation layer, the gas source was switched to pure Ge$_2$H$_6$, to eventually produce a thick composite film (800 nm) representative of the two growth modes. We note that the growth rate during the latter stage using pure Ge$_2$H$_6$ is 4-5 times higher that that using the 1:15 mixture.

Figure 3:
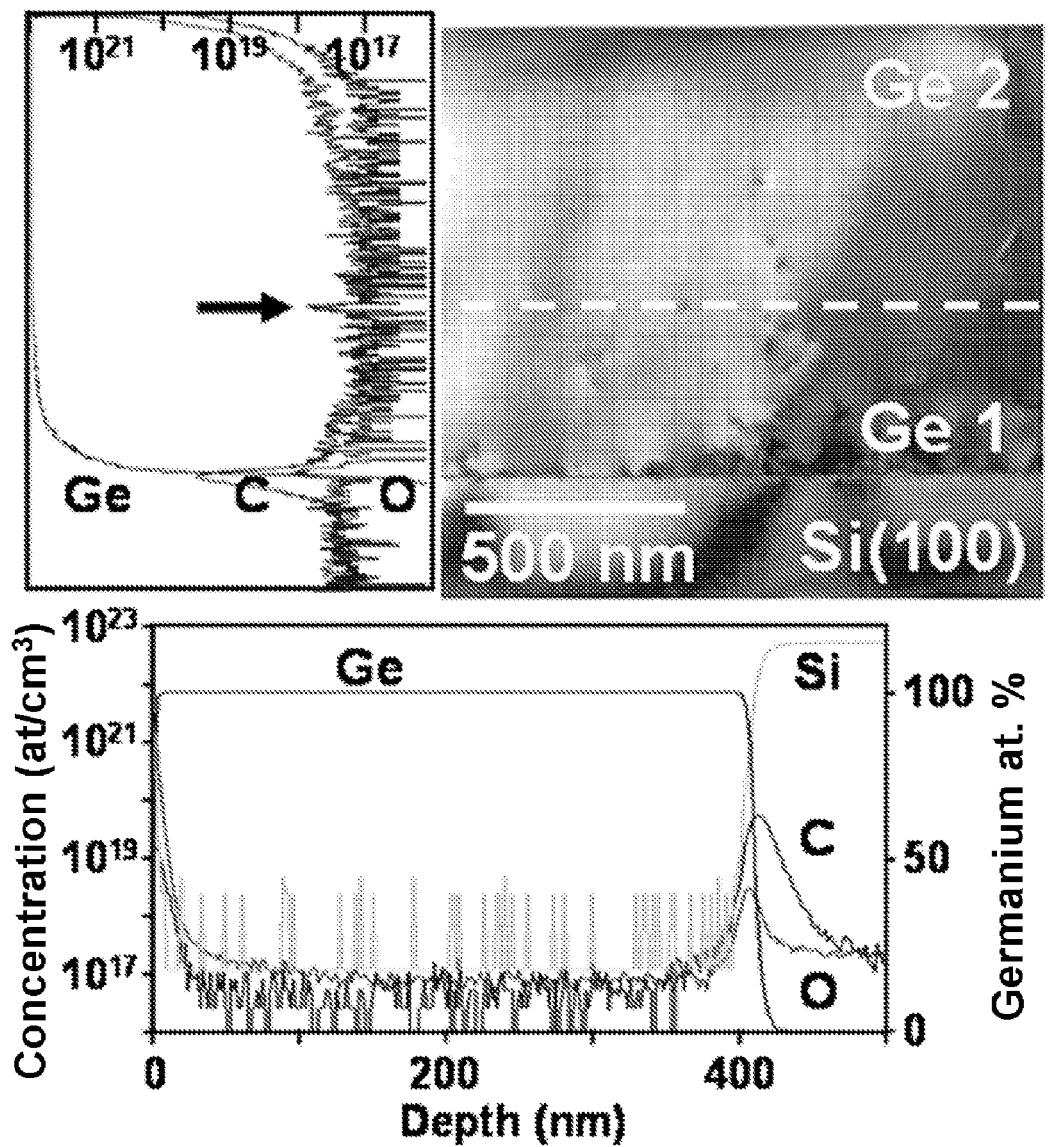
FIG. 3 shows (Top left) SIMS of a Ge film deposited using $(GeH_3)_2CH_2/Ge_2H_6$ in 1:15 ratio (region Ge1) followed by in situ growth of pure $Ge_2H_6$ (region Ge2). (right) Corresponding XTEM bright field image showing the complete Ge layer which is free of penetrating defects and displays a smooth surface. Arrow and dotted line indicate the switchover point in the growth. (Bottom) SIMS profile of an 800 nm Ge film showing no measurable C contamination across the layer. Impurity level C and O peaks are observed at the sharp Ge/Si interface.

XTEM and AFM examinations of the full sample thickness revealed a complete, continuous and monocrystalline layer with an atomically flat surface (AFM RMS ~0.4 nm). XTEM also showed that the microstructure throughout the growth transition region is continuous and indistinguishable form the bulk material, indicating that the layer-by-layer growth is uninterrupted in the absence of (GeH$_3$)$_2$CH$_2$. SIMS profiles showed a constant Ge content throughout the entire thickness and the typical C and O impurity peaks located at the interface (FIG. 3). In addition, a small and distinct C and O signal can be seen slightly above the noise at the switchover point, 250 nm above the Si/Ge interface. These minor impurities likely originate from exposure of the surface to the reactor ambient during the ~1 hour switch-over. These results indicate that the "CH$_2$" fragment of the precursor is continuously eliminated as methane at the growth front and does not accumulate on the Ge surface or become incorporated into the film. Furthermore this two step process yields high growth rates >20 nm/min. making the method viable for large scale fabrication.

In contrast, recent growth studies of Ge on Si, suggest that conventional Sb or As surfactants alter the free energy of the growth surface and promote layer-by-layer growth far beyond the critical thickness (see, Stirman et al., Appl. Phys. Lett. 84, 2530 (2004)). These surfactants remain on the growth surface where they effectively serve a catalytic role throughout the subsequent growth process by mediating chemisorption interactions between the reactants and the surface, reactant diffusion and reducing surface tension.

Example 4

Deposition of Si

A pure silicon film was grown on top of a Ge initiation layer (prepared according to Example 1) via decomposition of $SiH_3SiH_2SiH_3$. This compound incorporates highly reactive $SiH_2$ groups, allowing the formation of monocrystalline Si at unprecedented low temperatures (400-420° C.) despite of the lower surface energy of the Ge template, which is known to severely hinder such growth in conventional MBE-based processes.

Figure 11:
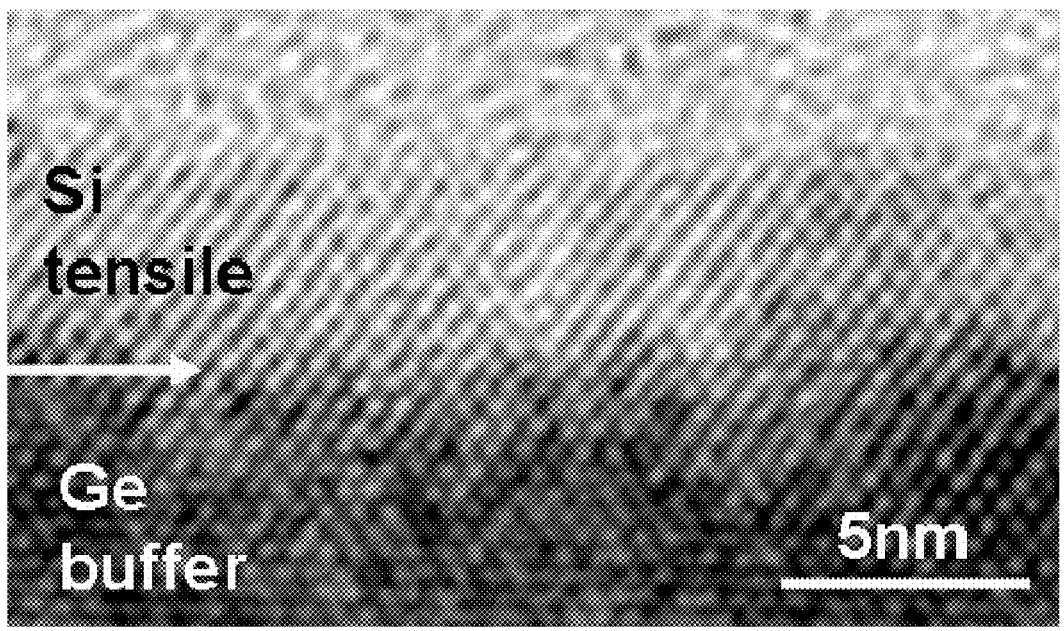
FIG. 11 is an XTEM micrograph of a 5 nm Si film grown on a Ge buffer. The interface is fully epitaxial and the Si epilayer is partially strained (1.5%) because the film has exceeded the critical thickness.
Figure 12:
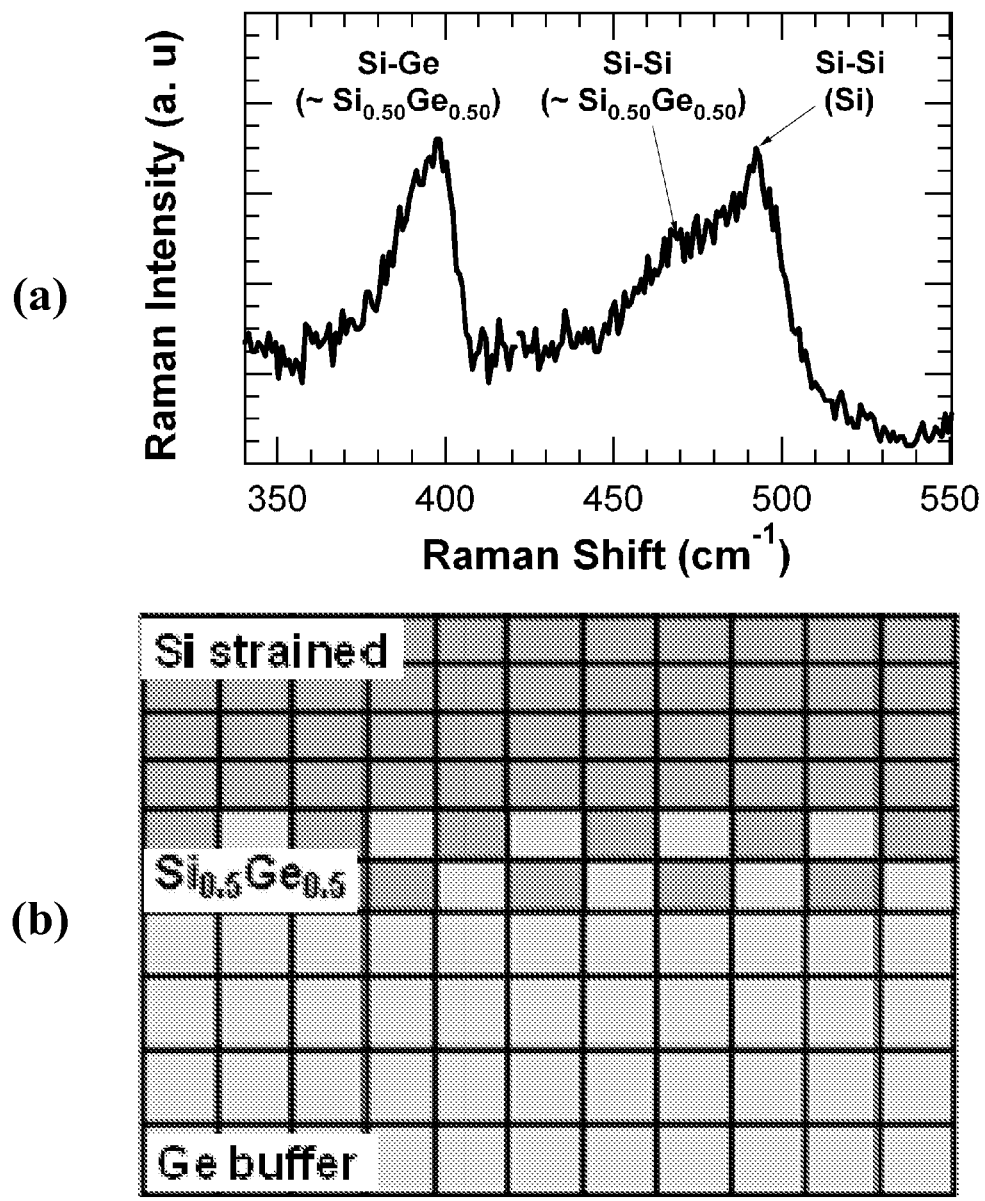
FIG. 12 shows (Left panel) a Raman spectra showing the Ge—Si, and Si—Si peaks of a fully coherent $Si/Si_{0.50}Ge_{0.50}$ structure. The tensile strained Si overlayer with thickness ~2.0 nm is grown on a Ge buffer via a self-assembled sub-nanometer thick ~$Si_{0.50}Ge_{0.50}$ interface layer. (Right panel) Schematic showing a fully coherent heterostructure comprised of the cubic Ge buffer (light gray squares), the tetragonally distorted SiGe interface (light and dark gray) and the tensile strained Si overlayer (dark gray).

A series of Si films with thicknesses ranging from 2-16 nm were deposited using conditions similar to those described above for the Ge growth. High resolution XTEM was used to characterize the crystallinity, surface morphology and epitaxial registry of the films. FIG. 11 shows the entire Si film thickness (~5 nm) including the interface region with the Ge buffer in high resolution. The microstructure appears to be fully commensurate and the layer surface atomically smooth. FIG. 12 shows the Raman spectra of a sample with a 2.5 nm Si film on Ge. The spectrum shows features similar to the Si—Ge and Si—Si Raman peaks in a $Si_{0.5}Ge_{0.5}$ alloy and a high-energy peak that can be assigned to a pure Si layer. This peak is down shifted by about 30 $cm^{-1}$ with respect to the Raman frequency in bulk Si, which according to Eq. (1) is consistent with a strain level of 4%. A full Raman study of the growth of Si on Ge buffers will be presented elsewhere. This study indicates that the $Si_{0.5}Ge_{0.5}$ alloy is confined to the immediate interface between Ge and Si and that highly strained Si films grow upon subsequent Si deposition (see FIG. 12 for a schematic interpretation of the growth).

The trisilane deposition directly on our Ge buffers described here establishes proof-of-principle routes for producing continuous, fully-pseudomorphic, Si layers with tensile-strained structures and atomically flat surfaces. The successful growth of crystalline Si showing a fully commensurate hetero-interface unambiguously confirms that the original Ge buffer layer surface must be free of significant carbon containing impurities originating from decomposition of the organic source. These buffers should also provide an ideal platform for producing Si epilayers with record high strain states that cannot be accessed via the currently available $Si_{1-x}Ge_x$ (x=~0.20) counterparts, due to their smaller lattice dimensions. Such materials are desirable for high mobility electronic device applications. The growth of Si directly on Ge would also create new opportunities for the development of Ge-based Metal-Oxide-Semiconductor (MOS) devices (see, Shang et al, IBM Journal of Research and Development 2006, 50, 377). Additionally, thin Si films can act as passivation layers for the growth of high-k dielectrics on Ge (see, De Jaeger et al., Microelectronic Engineering 2005, 80, 26).

Example 5

Selective Growth in Semiconductor Device Structures

Selective growth was conducted using a wafer provided by ASM America (Phoenix Ariz.), incorporating various device architectures including simple transistor structures and various patterns masked by amorphous nitride and oxide thin layers. The wafer was cleaved to produce substrates with suitable dimensions to fit the sample stage of the growth chamber. These were rinsed with methanol and then dipped in HF to remove the thin oxide covering the bare Si surface on the wafer while preserving the nitride masked areas essentially intact. The resulting samples were inserted into the reactor and flashed briefly for 1 sec at 1000° C. to remove any residual contamination from the surface. The Ge films were grown for 30 minutes at 370° C. and $5 \times 10^{-5}$ Torr using the 1:15 mixture of $(GeH_3)_2CH_2/Ge_2H_6$ which was routinely employed for deposition directly on Si. The "as deposited" samples exhibited an appearance essentially identical to that of the underlying patterned wafer material. Optical microscopy revealed that the appearance of the nitride/oxide masked regions was unchanged while the coloration of the Si-based areas was changed from a metallic grey, typical of Si, to a light brownish hue indicating that selective deposition had occurred. A comprehensive characterization of the wafers by RBS, XRD, AFM, XTEM and EDX (energy dispersive x-ray) revealed the presence of atomically flat Ge films with single crystalline and fully relaxed microstructures throughout the sample.

Figure 13:
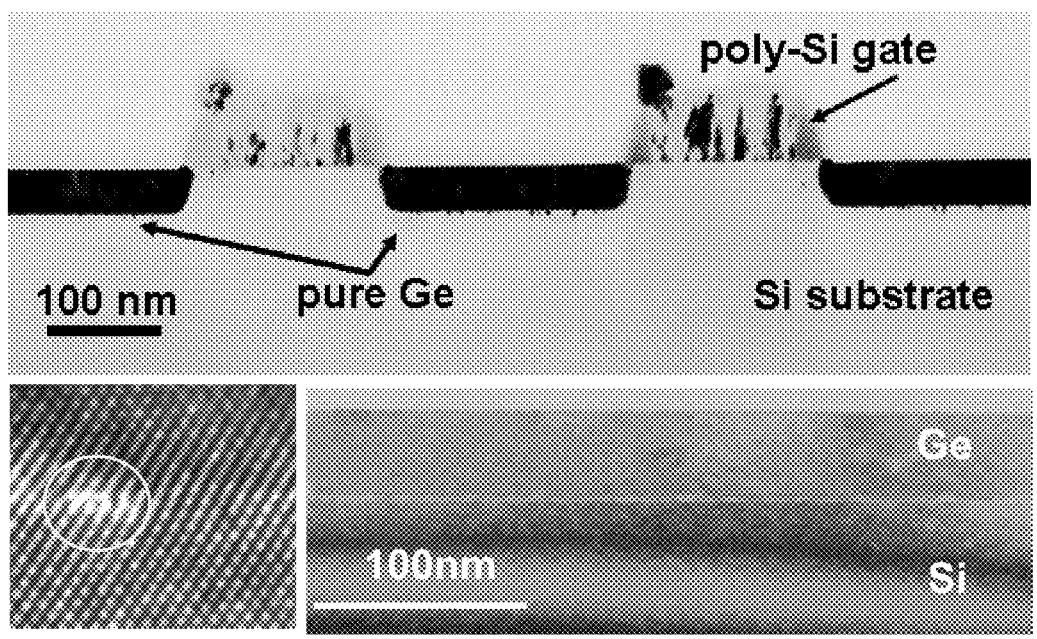
FIG. 13 shows (a) Ge trenches grown selectively in the "source" and "drain" areas of a device. Note the absence of any deposition on nitride spacers or on the polysilicon gate hardmask. (b) Micrograph of the Ge/Si interface showing the location of an edge dislocation (circle). (c) XTEM image illustrating the formation of smooth layers devoid of threading defects on Si exposed areas within the complex wafer structure.

The film nominal thickness was estimated by the random RBS spectra to be in the 45-50 nm range yielding an average growth rate of ~2 nm per minute. The channeled spectra indicated that the material was highly aligned and commensurate with the underlying substrate. The XTEM micrograph in FIG. 13 confirms that the deposition of Ge occurred selectively in the "source" and "drain" areas of the devices and not on the nitride spacers or on the polysilicon gate hardmask. High resolution images of the interface showed a perfect epitaxial registry between the Ge film and the surrounding Si wafer structure with typical edge dislocations accommodating the strain differential between the materials. The micrographs clearly demonstrated that the Ge deposited conformably on the sidewalls and bottom of the trench portion of the device feature entirely filling the drain/source region. The perfectly flat surface morphology of the Ge layer, as shown in the AFM and XTEM images (FIG. 13c), is consistent with a layer-by-layer growth mode. We note that the polygermanium nodule that is observed at the corner of the spacer and the gate hardmask (FIG. 13a) is where the wet etch broke through the hardmask enabling germanium nucleation from the underlying polysilicon. The occurrence of these nodules can be controlled by further refining the HF-based etching process. Future experiments will focus on perfecting the sample preparation and growth conditions to produced relaxed and strained materials on large area substrates to enable measurements of the electrical and optical properties on entire arrays of device structures. The seamless and fully conformal growth of strained Ge in the recessed source/drain regions might provide a route to extending the use of group IV materials to induce compressive strain in the silicon channel for increased hole mobility applications.

Example 6

Calculations of Surface Energetics

It is well-known that under the temperature/pressure parameters described above, Ge film growth using pure digermane proceeds via the classic Stranski-Krastanov process by formation and coalescence of three dimensional islands, ultimately leading to the creation of rough films dominated by surface undulations. Collectively, our experiments demonstrate that small concentrations of the $(GeH_3)_2CH_2$, $GeH_3CH_3$ organic additives can profoundly alter this conventional film growth mechanism, leading to the assembly of flat, strain-free films with record low defect densities. The highest quality films are obtained for optimum concentration ratios of 1:10 for $GeH_3CH_3$ and 1:15 for $(GeH_3)_2CH_2$ in digermane.

To elucidate how the organic derivatives influence the classic digermane growth process so dramatically we use fundamental bond energies as a guide to develop plausible surface reaction mechanisms. We proceed with the following assumptions: (i) The low temperatures and pressures ($10^{-5}$ Torr) preclude gas phase reactions amongst the various deposition species ($GeH_3CH_3$ or $(GeH_3)_2CH_2$, and $Ge_2H_6$), (ii) the strong C—H bonds prevent facile degradation of the $GeH_3$—$CH_3$ or $GeH_3$—$CH_2$—$GeH_3$ precursors in this temperature range (iii) the precursors react at the growth front by forming Ge—Ge bonds with the underlying surface. This implies that they do not simply physisorb to act as kinetic dilutants or non-bonded surface diffusion barriers but participate in the growth of the film via the deposition of their $GeH_3$ groups.

Simple gas kinetics dictates that the arrival rate of gaseous species at a surface is given by the classic formula $J=P/\sqrt{2\pi m k_B T}$, where P=pressure, T=temperature, m=molecular mass and $k_B$ is Boltzmann's constant. At a typical temperature of 360° C., and P=5×10$^{-5}$ Torr, this model gives arrival rates of 70, 60 and 50 molecules/nm$^2$/s for the pure, undiluted $(GeH_3)_2CH_2$, $Ge_2H_6$ and $GeH_3CH_3$ compounds, respectively. For the specific case of a 1:10 mixture of $GeH_3CH_3$ to $Ge_2H_6$ the corresponding flux ratio is also 1:10, which indicates that a significant number of $GeH_3CH_3$ molecules arrive at any given time. Using a sticking coefficient σ=0.05, which is a typical value of $Ge_2H_6$ on Si surfaces at these conditions (see, Schwarz-Selinger et al., *Phys. Rev. B* 2002, 65, 125317) we obtain a growth rate R=ΩJσ a equal to ~4-5 nm/min (where Ω=22.7 Å$^3$ is the volume per Ge atom in the film). The R value in this case is remarkable close to that of the growth rates obtained in the experiments described previously. However, the predicted growth rate using the above formula decreases with increasing temperature, in contradiction with our observation that the growth rates increase slightly in going to 420° C. This clearly indicates that higher reaction rates at 420° C. must contribute to the rate of growth.

In the case of deposition of pure $GeH_3CH_3$ at 360° C. the lack of a measurable growth rate in spite of the significant impingement flux indicates that a certain minimum concentration of digermane is required at the growth front to activate the release of methane, otherwise the accumulation of organic derivatives might lead to surface passivation and termination of growth. In a related control experiment using $(GeH_3)_2CH_2$ at a concentration ratio of 1:2-1:5 no measurable growth was observed, corroborating the notion that excess organic derivatives could lead to "surface poisoning". This assumption precludes a mechanism based on a simple physisorption model and also suggests that the molecules react with the growth surface in the presence of digermane.

Figure 14:
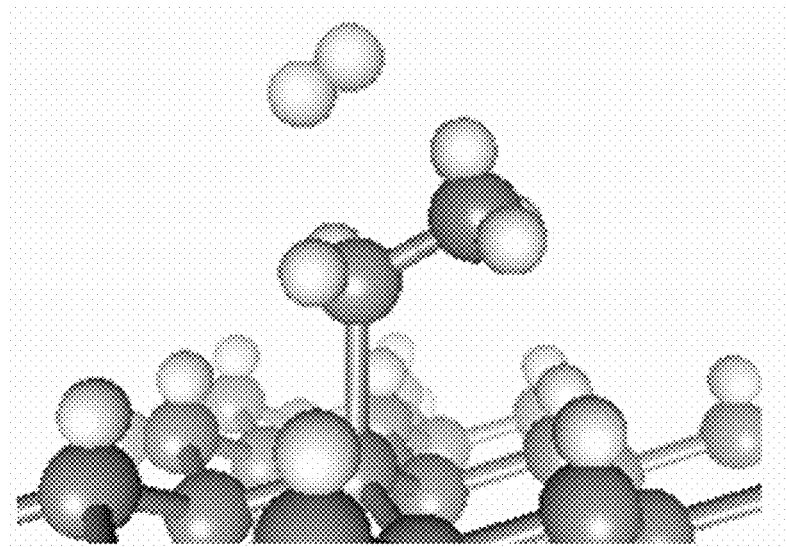
FIG. 14 shows surface intermediates formed by the reaction of the $GeH_3CH_3$ and $(GeH_3)_2CH_2$ with the hydrogenated film surface. Dark grey, grey and white spheres represent Ge, C and H atoms, respectively.
Figure 14:
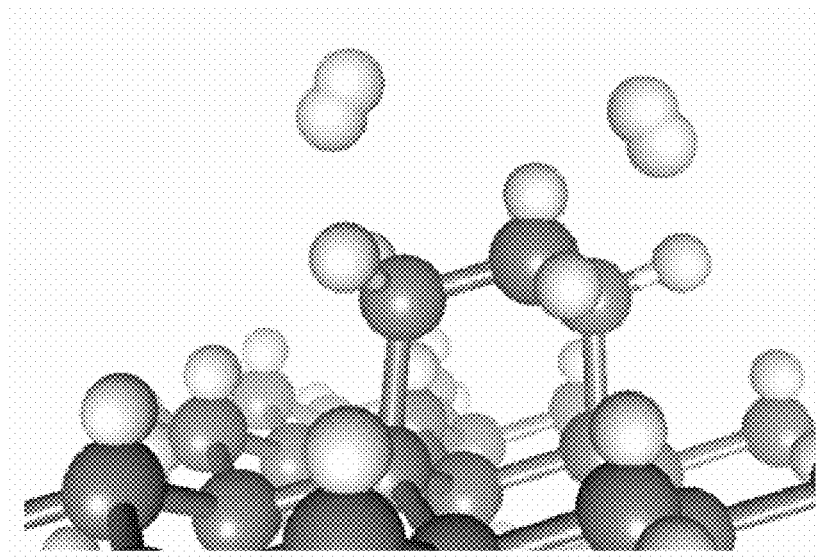

Accordingly, we assume that in both cases the $CH_3GeH_3$ and $(GeH_3)_2CH_2$ react and bond to the surface via the Ge atoms of the $GeH_3$ ligands. This likely involves the formation of surface intermediate species comprised —$GeH_2$—$CH_3$ and —$GeH_2$—$CH_2$—$GeH_2$— complexes, respectively which remain intact at the low growth operating temperatures of 360-420° C. due to the strong C—H and Ge—C bonds (see FIG. 14). These intermediates are envisioned to be analogous in both function and size to the traditional Sb or As surfactant atoms used to produce flat Ge films grown on mismatched substrates. They promote wetting and suppress diffusion of the Ge adatoms, thereby enforcing the formation of a flat surface morphology. In our experiments the surface bonded —$GeH_2$—$CH_3$ or $GeH_2$—$CH_2$—$GeH_2$— intermediates also promote flat layer growth by effectively serving as site holders which facilitate the organized assembly of smooth films and are continuously replenished by the incident molecular precursor flux. Unlike conventional surfactants, which are admitted at the onset of growth and then recycled, these organic species react and desorb $CH_4$, which is generated via Ge—C cleavage induced by incoming $Ge_2H_6$ reactant molecules or by $H_2$ reaction byproducts. Thus as the molar concentration of organics is increased from an optimal value to the lowest 1:0 limit, the accumulation of unreacted intermediates saturates the available reaction sites preventing further Ge growth.

A similar mechanism is also operative in CVD of SiGe films on Si where adsorbed H is well-known to suppress diffusion of $GeH_x$ and thus promote layer-by-layer growth. In our system the heavier and chemically robust organic units provide an effective diffusion barrier on the time scale of $H_2$ desorption. Furthermore, the low temperature reduces the diffusion rate of mobile surface species such as H and Ge adatoms. Although the solubility of C into Ge is negligible, its incorporation into the lattice as a metastable substitutional impurity is nevertheless possible at these low temperatures. However, this requires breaking of multiple C—H bonds, which is unlikely on thermodynamic grounds under these conditions (350-420° C., 10$^{-5}$ Torr pressure).

Ultimately the elimination of the $CH_2$ and $CH_3$ groups as $CH_4$ is the dominant driving force in this process. This can be quantified using bond enthalpies, which allow approximate calculation of the various plausible surface reactions involving these compounds on H-terminated Ge surfaces which mimic the local growth environment. Although some of the required bond enthalpies are known, the values involving Ge are not fully available (see, Bills and Cotton, *J. Phys. Chem.* 1964, 68, 806). For this purpose, and for internal consistency in our estimates, we have conducted ab initio calculations to determine the bond enthalpies involving H, C and Ge binary combinations. Using the B3LYP functional at the N311++ (2d,2p) level of theory we obtain the values listed in Table 1.

TABLE 1

Calculated bond enthalpies for bonds between H, C and Ge (available experimental values are in parentheses).

|    | H        | C        | Ge      |
|----|----------|----------|---------|
| H  | 110 (104)| 105 (99) | 73 (69) |
| C  |          | 80       | 56 (58) |
| Ge |          |          | 38      |

Figure 15:
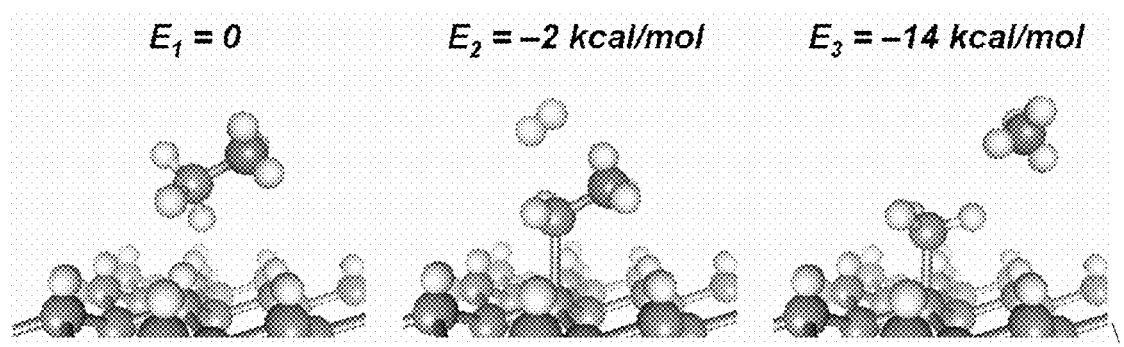
FIG. 15 shows proposed two-step reaction process involving the evolution of methane and the adsorption of germyl (third scenario described in the text).

We consider three mechanisms for the reaction of the $GeH_3CH_3$ molecules with the Ge growth surface as shown FIG. 15. In reaction 1 shown below (Rx1), the molecule decomposes via breaking the Ge—C bond, to adsorb the methyl ($CH_3$) and the germyl ($GeH_3$) fragments onto the Ge—H surface. The corresponding reaction energy obtained from the bond enthalpies equals $\Delta H = -2$ Kcal/mole, assuming that the entropy change for the process is zero.

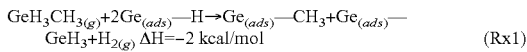
(Rx1)

The second reaction can viewed as a two step process involving the formation of a surface intermediate complex in which the —$CH_2GeH_3$ ligand is bonded to the surface via the $CH_2$ functionality (Rx2a),

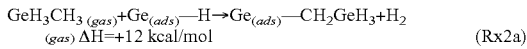
(Rx2a)

The reaction energy of this step is +12 kcal/mol (as shown below) indicating that the formation of GeC bonds on the surface is unfavorable. In the second step the complex decomposes with the release of germane and the binding of a methyl group (Rx2b):

$Ge_{(ads)}$—$CH_2GeH_3+H_{2\ (gas)} \rightarrow Ge_{(ads)}$—$CH_3+GeH_4$ $_{(gas)} \Delta H = -12$ kcal/mol (Rx2b)

The net reaction energy is thus zero because the same number and type of bonds are broken and formed (Rx2a+Rx2b):

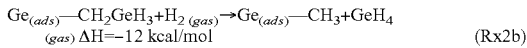
(Rx2a+Rx2b)

The third reaction involves a two step mechanism in which the precursor is adsorbed via the —$GeH_2$ functionality, with a reaction energy of −2 kcal/mol (compared with +12 kcal/mol in the second reaction scenario above). Here, however, the subsequent decomposition step releasing the extremely robust methane molecule, and binding the germyl group onto the Ge surface, evolves an additional −12 kcal/mol. As expected, this is the most favorable reaction with a net overall energy of −14 kcal/mole (Rx3):

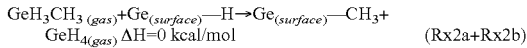
(Rx3)

From a chemical point of view the release of methane thus represents the dominant driving force in the growth reactions involving the $CH_3$—$GeH_3$ precursor.

Figure 16:
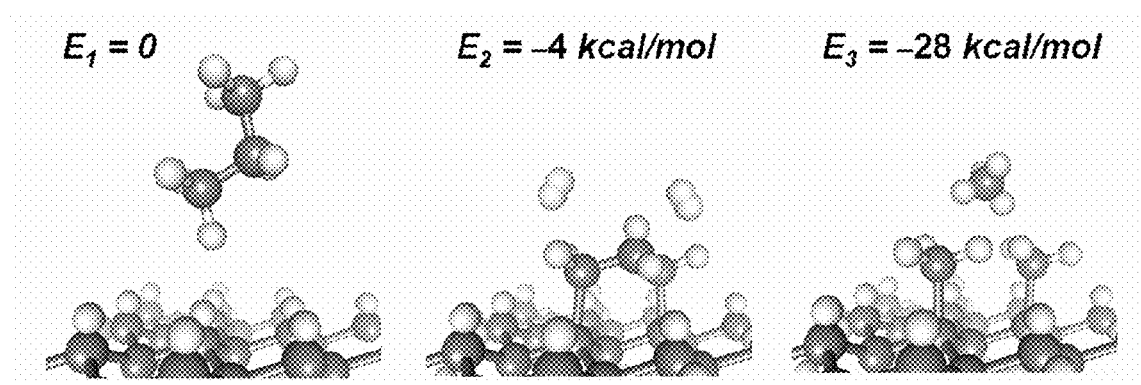
FIG. 16 shows a proposed two-step reaction process involving adsorption of $GeH_3$—$CH_2$—$GeH_3$ compound via evolution of methane.

For the reaction $GeH_3$—$CH_2$—$GeH_3$ compound we consider only two plausible reaction schemes for the incoming molecules with the Ge growth surface (FIG. 16). The first proceeds with the attachment of a single germyl group to the surface, while the second involves simultaneous binding of both germyl end members to the surface. The third possibility in which the molecules binds to the surface via the central —$CH_2$— is highly unfavorable on energetic grounds and is not considered.

In the first case the —$GeH_3$ ligand of $GeH_3$—$CH_2$—$GeH_3$ attaches to the surface via a single proton transfer and releases $GeH_3CH_3$. This process is dominated by the breaking of one of the Ge—C bonds, leading to a net energy change of +24 Kcal/mole (note that $H_2$ is not evolved in this process). Since the associated entropy change is small (unimolecular reaction) the process is dominated by the enthalpy change, and is thus highly endothermic. If we consider that the $GeH_3CH_3$ then reacts with the surface via methane abstraction as described by (Rx3, −14 Kcal/Mole) the net energy for the entire deposition reaction is:

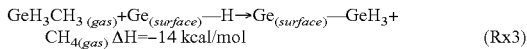

On the basis of this simple analysis growth via this decomposition route is thus unfavorable.

In the case where both $GeH_3$ end members of $GeH_3$—$CH_2$—$GeH_3$ bind to the surface, as shown in FIG. 16, we obtain a strained methylene-bridged —$GeH_2$—$CH_2$—$GeH_2$— complex via the liberation of 2 $H_2$ molecules and an energy change of −4 Kcal/mole. In the next step methane is released with a corresponding reaction energy of −24 Kcal/mole. The net reaction energy for this entire process is therefore −28 Kcal/mole, or −14 Kcal/mole per —$GeH_3$ adsorbed. This is therefore a highly favorable route comparable to that described by (Rx3). Note that the significant bond strain associated with the methylene-bridge —$GeH_2$—$CH_2$—$GeH_2$— complex is due to the small size of the carbon atoms compared to Ge and likely promotes the facile removal of the $CH_2$ as methane.

Figure 17:
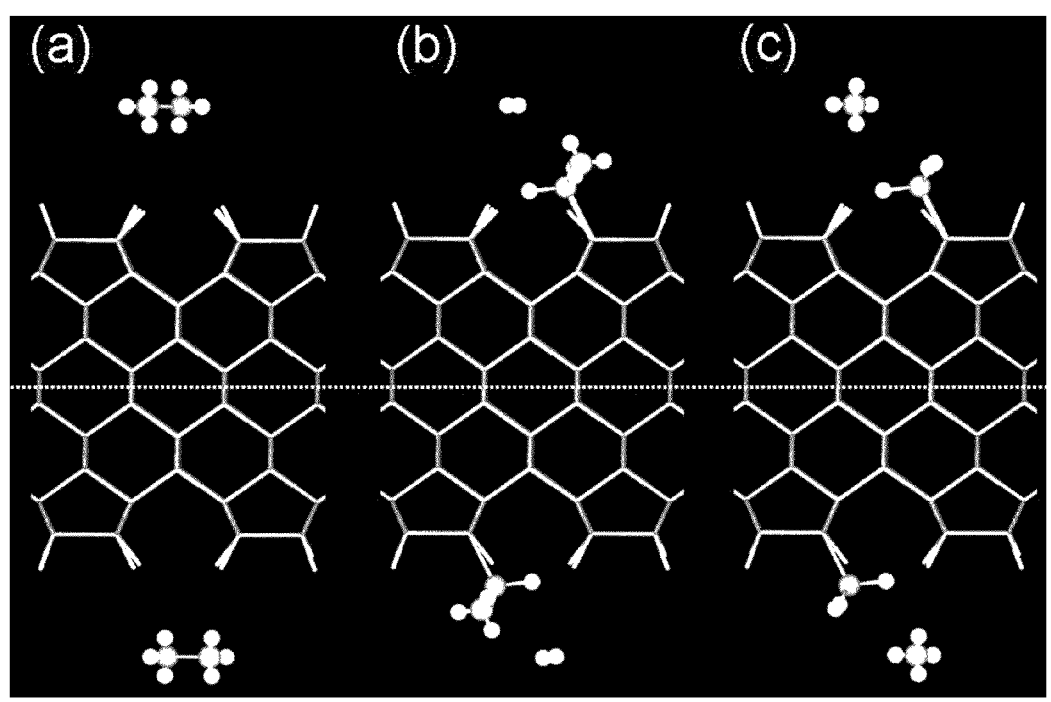
FIG. 17 shows supercell geometries used for the calculation of adsorption energies of $GeH_3CH_3$ on a hydrogenated (2×1) Ge(001) surface. Reactions Rx1, Rx2 and Rx3 are depicted in panels (a), (b) and (c), respectively. The dotted line represents the center of the slab, where bulk conditions prevail.

To corroborate the surface reaction energies obtained from bond enthalpies we carried out a series of large-scale control calculations for the $GeH_3CH_3$ on a proton terminated Ge(001) surface using state-of-the-art electronic structure simulations at the LDA level. A parallel implementation of the VASP code (see, Madelung, *Semiconductors, Landolt Börstein New Series III*; Springer-Verlag: Berlin, N.Y., 2001) was used to obtain all of the optimized structures and electronic properties. The hydrogen terminated Ge(001) substrate was represented by a 180 atom slab with a thickness sufficient to ensure complete bulk behavior in the interior and a large supercell dimension of 80 Å normal to the surface was used to minimize coupling between periodic slab replicas. To preclude the development of long range fields we adopted configurations with symmetrical molecular adsorption geometries on both sides of the slab, as shown in FIG. 17. Core electrons were replaced by ultra-soft pseudoptentials and the remaining valence electrons were expanded in a plane-wave basis using an energy cutoff of 500 eV, and single k-point sampling at F. Unlike our simple bond enthalpy models above the large-scale slab representations adopted here implicitly incorporate surface relaxation effects induced by the adsorbing molecules. This may be particularly important in the case of $(GeH_3)_2CH_2$ adsorption since the methylene-bridge —$GeH_2$—$CH_2$—$GeH_2$— complex may transfer strain from the complex to the surface. Our detailed simulations confirm that the adsorbed complex bears the majority of the distortion while the surrounding Ge substrate remains essentially unperturbed. Accordingly, in this case the simple addition of bond enthalpies is fairly quantitative. In fact our calculated energies confirm the general trends predicted by the bond enthalpy calculations for all cases considered. For example, in Reaction Rx2, where the methyl is adsorbed and $GeH_4$ is released, we find a energy change of −1 kcal/mol for the overall process. This is close to zero, as expected on the basis of bond formation/breakage discussed above. Similarly, the most energetic reaction involving the release of methane and the binding of a $GeH_3$ occurs with an energy difference of −17 kcal/mol, which is very similar to the value −14 kcal/mol predicted using bond enthalpies. The main origin of this energy difference is the use of the LDA in the slab calculations and B3LYP treatment in the bond enthalpies. A ~20-30% overbinding is typical of LDA with respect to B3LYP, suggesting that bond enthalpies in Table 1 can be used as a reasonable quantitative tool for characterizing the simple surface reactions in our H—C—Ge system.

We claim:

1. A method for preparing a semiconductor structure, comprising forming a Ge layer on a semiconductor substrate using an admixture of (a) $(GeH_3)_2CH_2$ and $Ge_2H_6$;
(b) $GeH_3CH_3$ and $Ge_2H_6$; or
(c) $(GeH_3)_2CH_2$, $GeH_3CH_3$ and $Ge_2H_6$,
wherein in all cases, $Ge_2H_6$ is in excess.

2. The method of claim 1, wherein the admixture is present in a ratio of between 1:5 and 1:30.

3. The method of claim 1, wherein the semiconductor substrate comprises silicon.

4. The method of claim 1, wherein the semiconductor substrate comprises two or more surface materials, wherein the first surface material comprises an elemental semiconductor material or alloy, and the second surface material comprises an oxide, nitride, or oxynitride of an elemental semiconductor material or alloy, and wherein the Ge layer if formed over only the first surface material.

5. The method of claim 3, wherein the silicon comprises Si(100).

6. The method of claim 1, wherein forming the Ge layer is accomplished via gas source molecular beam epitaxy at between 350° C. to 430° C.

7. The method of claim 1, wherein the Ge layer comprises a plurality of Ge layers.

8. The method of claim 1, wherein the Ge layer is virtually strain free.

9. The method of claim 1, wherein the Ge layer is virtually atomically flat.

10. The method of claim 1, wherein the Ge layer has a threading dislocation density below $10^5/cm^2$.

11. The method of claim 1, further comprising contacting the Ge layer with a silane under conditions whereby a silicon-based layer is formed over the Ge layer.

12. The method of claim 11, wherein the silane is trisilane.

13. The method of claim 11, wherein the silicon-based layer comprises elemental Si.

14. The method of claim 11, further comprising forming a high-k dielectric layer over the silicon-based layer.

15. The method of claim 14, wherein the high-k dielectric layer comprises $SiN_x$, $Ta_2O_5$, $Al_2O_3$, HfSiON, $HfO_2$, HfSiO, $ZrO_2$, HfZrSiO ZrSiO, $La_2O_3$, $LaAlO_3$, PZT, or mixtures thereof.

16. The method of claim 1, further comprising contacting the Ge layer with a second gas source consisting essentially of $Ge_2H_6$, wherein the Ge layer is an initiation layer having a thickness of greater than 50 nm.

17. A semiconductor structure produced by the method of claim 1.

18. A method for depositing a Ge layer on a substrate in a reaction chamber, comprising
introducing into the chamber a gaseous precursor comprising an admixture of
(a) $(GeH_3)_2CH_2$ and $Ge_2H_6$;
(b) $GeH_3CH_3$ and $Ge_2H_6$; or
(c) $(GeH_3)_2CH_2$, $GeH_3CH_3$ and $Ge_2H_6$, wherein in all cases, $Ge_2H_6$ is in excess under conditions whereby a layer comprising a Ge material is formed on the substrate.

19. The method of claim 18, wherein the gaseous precursor is in substantially pure form.

20. The method of claim 18, wherein a single gas source comprises the gaseous precursor.

21. The method of claim 18, wherein the gaseous precursor is intermixed with an inert carrier gas.

22. The method of claim 21, wherein the inert carrier gas comprises $H_2$ or $N_2$.

23. The method of claim 18, wherein the gaseous precursor is deposited by gas source molecular beam epitaxy.

24. The method of claim 18, wherein the gaseous precursor is introduced at a temperature of between 350° C. and 430° C.

25. The method of claim 18, wherein the gaseous precursor is introduced at a partial pressure between $10^{-8}$ Torr and 1000 Torr.

26. The method of claim 18, wherein the Ge layer is formed on the substrate has an atomically planar surface.

27. The method of claim 18, wherein the Ge layer has a threading dislocation density below $10^5/cm^2$.

* * * * *